US008986596B2

(12) United States Patent
Cheng et al.

(10) Patent No.: US 8,986,596 B2
(45) Date of Patent: Mar. 24, 2015

(54) METHODS OF FORMING NANOPARTICLES USING SEMICONDUCTOR MANUFACTURING INFRASTRUCTURE

(71) Applicant: International Business Machines Corporation, Armonk, NY (US)

(72) Inventors: Joy Cheng, San Jose, CA (US); Daniel J. Coady, San Jose, CA (US); Matthew E. Colburn, Schenectady, NY (US); Blake W. Davis, Hollister, CA (US); James L. Hedrick, Pleasanton, CA (US); Steven J. Holmes, Guilderland, NY (US); Hareem T. Maune, San Jose, CA (US); Alshakim Nelson, Freemont, CA (US)

(73) Assignee: International Business Machines Corporation, Armonk, NY (US)

( * ) Notice: Subject to any disclaimer, the term of this patent is extended or adjusted under 35 U.S.C. 154(b) by 264 days.

(21) Appl. No.: 13/680,071

(22) Filed: Nov. 18, 2012

(65) Prior Publication Data

US 2014/0138863 A1    May 22, 2014

(51) Int. Cl.
*B81C 1/00* (2006.01)
*B29B 9/16* (2006.01)
*B82Y 40/00* (2011.01)

(52) U.S. Cl.
CPC . *B29B 9/16* (2013.01); *B82Y 40/00* (2013.01); *B81C 1/00214* (2013.01)
USPC .................. 264/496; 264/297.1; 264/297.8; 264/334

(58) Field of Classification Search
None
See application file for complete search history.

(56) References Cited

U.S. PATENT DOCUMENTS

| 6,284,345 | B1 * | 9/2001 | Ruoff ............................ 428/143 |
| 7,563,613 | B2 | 7/2009 | Dennis et al. |
| 8,038,926 | B2 | 10/2011 | Gogotsi et al. |
| 8,263,129 | B2 * | 9/2012 | DeSimone et al. ........... 424/489 |
| 8,562,892 | B2 * | 10/2013 | Mason ....................... 264/297.8 |
| 8,753,559 | B2 * | 6/2014 | Yang et al. .................... 264/317 |
| 2005/0271794 | A1 | 12/2005 | DeSimone et al. |
| 2008/0171193 | A1 | 7/2008 | Yi et al. |
| 2009/0028910 | A1 | 1/2009 | DeSimone et al. |
| 2009/0136583 | A1 * | 5/2009 | Park et al. .................... 424/497 |
| 2010/0066346 | A1 | 3/2010 | Zhang et al. |
| 2010/0151031 | A1 | 6/2010 | DeSimone et al. |
| 2011/0147983 | A1 | 6/2011 | Cheng et al. |

(Continued)

OTHER PUBLICATIONS

Champion, et al., "Particle shape: A new design parameter for micro- and nanoscale drug delivery carriers," Journal of Controlled Release 121 (2007) 3-9; Available online Apr. 11, 2007.

(Continued)

*Primary Examiner* — Mary F Theisen
(74) *Attorney, Agent, or Firm* — Michael R. Roberts

(57) ABSTRACT

A method of preparing particles comprises forming by optical lithography a topographic template layer disposed on a surface of a substrate, which is suitable for spin casting. The template layer comprises a non-crosslinked template polymer having a pattern of independent wells therein for molding independent particles. Spin casting a particle-forming composition onto the template layer forms a composite layer comprising the template polymer and the particles disposed in the wells. The composite layer is removed from the substrate using a stripping agent that dissolves the template polymer without dissolving the particles. The particles are then isolated.

25 Claims, 21 Drawing Sheets

(56) References Cited

U.S. PATENT DOCUMENTS

| 2011/0147985 | A1 | 6/2011 | Cheng et al. |
| 2011/0186543 | A1 | 8/2011 | Hsieh |
| 2011/0190463 | A1 | 8/2011 | Xu et al. |
| 2012/0052286 | A1 | 3/2012 | Norwood et al. |
| 2012/0114559 | A1 | 5/2012 | Singh et al. |

OTHER PUBLICATIONS

Guan, et al., "Fabrication of polymeric microparticles for drug delivery by soft lithography," Biomaterials 27 (2006) 4034-4041; Available online Mar. 30, 2006.

Korean IPO, PCT/US2013070562, International Search Report and Written Opinion, ARC920120062PCT, mailed Feb. 27, 2014.

Randall, et al. "3D lithographically fabricated nanoliter containers for drug delivery," Advanced Drug Delivery Reviews 59 (2007) 1547-1561; Available online Sep. 4, 2007.

Yang, et al. "Nanomachining by Colloidal Lithography," small 2006, 2, No. 4, 458-475.

Champion, et al., "Particle shape: A new design parameter for micro- and nanoscale drug delivery carriers" Journal of Controlled Release 121 (2007) 3-9; Available online Apr. 11, 2007.

Champion, et al., "Role of target geometry in phagocytosis" PNAS vol. 103 No. 13, 4930-4934, Mar. 28, 2006.

Davis, et al., "Nanoparticle therapeutics: an emerging treatment modality for cancer", Nature Reviews:drug discovery, 7, 771-782, Sep. 2008.

Euliss, et al., "Imparting size, shape, and composition control of materials for nanomedicine," Chem. Soc. Rev., 2006, 35, 1095-1104; First published as an Advance Article on the web Sep. 20, 2006.

Liu, et al., "One-Pot Synthesis of Block Copolymer Coated Cobalt Nanocrystals," Chem. Mater. 2005, 17, 4985-4991, Published on Web Sep. 2, 2005.

Matsumara, et al., "A New Concept for Macromolecular Therapeutics in Cancer Chemotherapy: Mechanism of Tumoritropic Accumulation of Proteins and the Antitumor Agent Smancs," Cancer Research 46, 6387-6392, Dec. 1986.

Shi, et al., "Nanotechnology in Drug Delivery and Tissue Engineering: From Discovery to Applications," Nanoletters, 2010, 10, 3223-3230; Published on Web: Aug. 20, 2010.

Sun, et al., "Monodisperse $MFe_2O_4$ (M ) Fe, Co, Mn) Nanoparticles," J. Am. Chem. Soc. 2004, 126, 273-279; Published on Web Dec. 10, 2003.

Wagner, et al., "The emerging nanomedicine landscape," Nature Biotechnoligy, vol. 24, No. 10, Oct. 2006.

* cited by examiner

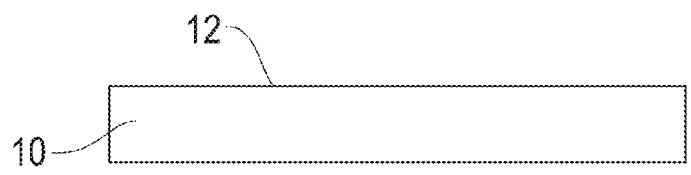
FIG. 1A
Prior Art
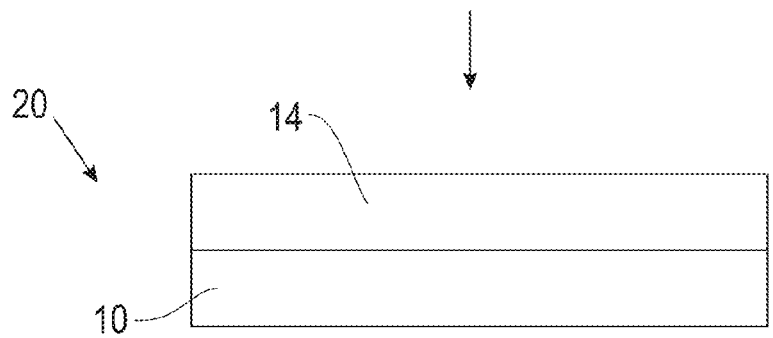
FIG. 1B
Prior Art
FIG. 1C
Prior Art
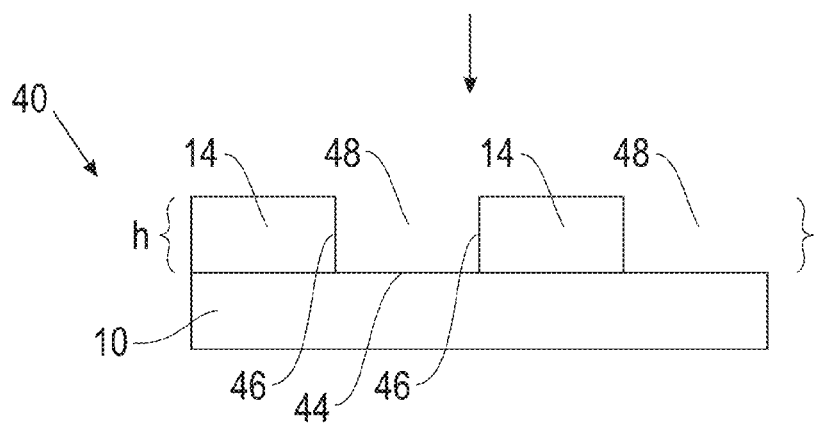
FIG. 1D
Prior Art

METHODS OF FORMING NANOPARTICLES USING SEMICONDUCTOR MANUFACTURING INFRASTRUCTURE

BACKGROUND

The invention relates to methods of forming nanoparticles using semiconductor manufacturing infrastructure, and more specifically to fabrication of particles having a defined shape and size using lithographically defined templates to mold the nanoparticles.

Nanoparticles have received significant interest for both diagnostic and therapeutic medical applications. Nanoparticles are particularly well suited for drug delivery applications. Many therapeutic agents, including drug molecules, siRNA, and proteins, have a short half-life and are quickly degraded or removed from circulation within the body. Other drug candidates exhibit poor solubility characteristics. Nanoparticles can serve as delivery vehicles, thereby mitigating the challenges of drug delivery and enhancing therapeutic activity by extending drug half-life, improving drug solubility, reducing immunogenicity, and controlling drug release (Shi, J.; Votruba, A. R.; Farokhzad, O. C.; Langer, R. NanoLett. 2010, 10, 3223-3230). The nanoparticles can be organic (derived from either small molecules or polymers), inorganic, or an organic-inorganic hybrid material. The therapeutic agents can be attached to or encapsulated within the nanoparticle. Moreover, the nanoparticles can actively or passively target specific cells to enable selective delivery.

The majority of nanotechnology-based therapeutics for drug delivery approved by the Food and Drug Administration are composed of a drug incorporated within, or attached to, a polymer, micelle, or liposome (Wagner, V.; Dullarrt, A.; Bock, A. K.; Zweck, A. Nat. Biotechnol. 2006, 24, 1211-1217. Davis, M. E.; Chen, Z.; Shin, D. M. Nat. Rev. Drug Discovery 2008, 7, 771-782). The size of these drug delivery vehicles is important. Most drug delivery vehicle complexes vary in size from tens to hundreds of nanometers. In the case of targeting tumor tissues, the size of the nanoparticle drug delivery agent should ideally be smaller than 150 nm in order to passively diffuse into the tumor cells via the enhanced permeability and retention (EPR) effect (Matsumura, Y.; Maeda, H. Cancer Res. 1986, 46, 6387-6392).

There is a growing understanding to those knowledgeable in the art that in addition to particle size, the particle shape is also an important parameter for potential drug delivery applications. The shape of the particle can control the nature of the interaction with the cell surface, and thus can be used to enable cell targeting based on shape (Champion, J. A.; Katare, Y. K.; Mitragotri, S. J. Control. Release 2007, 121, 3-9). Moreover, controlling both the size and shape can affect degradation rate, transport, targeting, and internalization of the drug delivery vehicle.

Despite the importance of particle size and shape in drug delivery, there exist only a few methods to fabricate non-spherical particles reproducibly on a large scale. Mitragotri has developed an approach which embeds a polymeric particle within a second polymeric film, and then uses heat combined with compression or extension to afford particles with non-spherical shapes (Champion, J. A.; Mitragotri, S. Proc. Natl. Acad. Sci. U.S.A. 2006, 103, 4930-4934). DeSimone has developed an imprint-based process for fabricating templates which can be used to mold precursors into a particle (Euliss, L. E.; DuPont, J. A.; Gratton, S.; DeSimone, J. Chem. Soc. Rev. 2006, 35, 1095-1104; J. M. Desimone, et al., US 2010/0151031A1).

Additional methods are needed to fabricate nanoparticles for therapeutic applications.

SUMMARY

A method comprises:

forming by optical lithography a topographic template layer disposed on a surface of a substrate, wherein i) the substrate is suitable for spin casting and ii) the template layer comprises a non-crosslinked template polymer having a pattern of independent wells therein for molding independent particles;

spin casting a particle-forming composition onto the template layer, thereby forming a composite layer comprising the template polymer and the particles disposed in the wells;

removing the composite layer from the substrate using a stripping agent that dissolves the template polymer without dissolving the particles; and isolating the particles.

Also disclosed is a method, comprising:

forming by optical lithography a patterned template on a substrate, wherein the template is insoluble in a particular organic solvent but soluble in a given aqueous and/or organic solution;

casting a formulation onto the patterned template, the formulation including material in the organic solvent;

removing the organic solvent, thereby leaving behind nanoparticles in contact with the template;

optionally treating the nanoparticles photochemically, thermally, and/or chemically;

using the solution to remove both the template and the nanoparticles; and isolating the nanoparticles from the template.

Another method is disclosed, comprising:

forming by optical lithography a patterned template on a substrate, wherein the template is insoluble in a particular organic solvent but soluble in a given aqueous and/or organic solution;

casting a formulation onto the patterned template, the formulation including material in the organic solvent;

removing the organic solvent, thereby leaving behind nanoparticles in contact with the template;

optionally treating the nanoparticles photochemically, thermally, and/or chemically;

removing the template using the solution, while leaving most of the nanoparticles behind on the substrate; and removing the nanoparticles from the substrate.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIGS. 1A to 1D are schematic cross-sectional layer diagrams showing a first PRIOR ART method of forming a template layer disposed on a substrate.

DETAILED DESCRIPTION

Figure 1E:
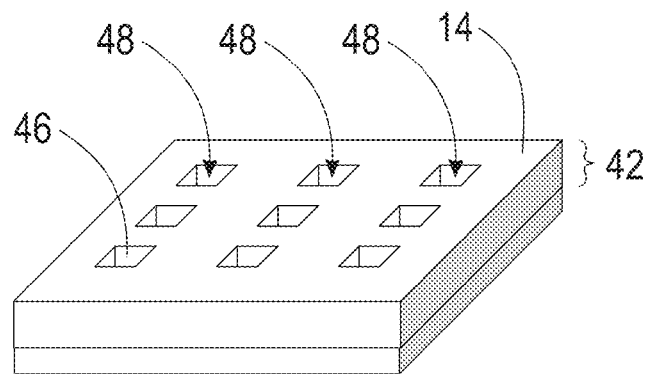
FIG. 1E is an angular overhead view of the layer structure of FIG. 1D.

Disclosed are methods of preparing particles using semiconductor manufacturing equipment and processes. The methods utilize a structure comprising a topographic template layer disposed on a substrate. The template layer is formed preferably by optical lithography. The substrate is a material suitable for spin casting. The template layer comprises a non-crosslinked polymer having a pattern of independent cavities (referred to as "wells") therein for molding independent particles. Each well of the template layer serves as a mold for forming a particle. The wells can have any desirable shape and size within the special and thickness limitations of the template layer and the resolution capabilities of the optical lithographic process used to form the wells. The wells can have any suitable depth within the template layer. The sidewall height of the wells is generally less than or equal to the thickness of the template layer. If desired, the wells can extend into the substrate. A hole is a well that extends from the top surface of the template layer to a surface of the substrate. Thus, a hole has a bottom surface that is a surface of the substrate.

A particle-forming composition is applied to the template layer using preferably a spin casting technique, thereby forming a composite layer. The composite layer comprises the template polymer and the molded particles, which are preferably substantially confined to the volume of the wells. The particles can be treated chemically, thermally and/or photochemically so long as the treatment does not crosslink the template polymer. The particles can then be isolated using any process that does not adversely affect the particle for its intended use. For example, the composite layer can be stripped from the substrate using a stripping agent that dissolves the template polymer without dissolving the particles, followed by isolating the particles from the resulting liquid mixture. The particles have utility as carriers for medically useful substances (cargoes), which include therapeutic agents (e.g., drugs) and/or diagnostic agents (e.g., image enhancing agents). In an embodiment, the particles have an average circular diameter of about 100 nm to about 500 nm.

Herein, the term "sub-particle" is defined as a pre-formed particle that is a component of the particle-forming composition spin casted on the template layer. The sub-particles and the disclosed particles can both be nanoparticles. The disclosed particles can comprise the sub-particles in the form of an aggregate, wherein the sub-particles are bound together in the aggregate by, for example, covalent bonding, ionic bonding, surface polymer mixing, and/or hydrophobic interactions occurring at contact sites of the sub-particles.

Therapeutic agents are biologically active, meaning the referenced material can alter the chemical structure and/or activity of a cell in a desirable manner, or can selectively alter the chemical structure and/or activity of a cell type relative to another cell type in a desirable manner. As an example, a desirable change in a chemical structure of a cell can be the incorporation of a gene into the DNA of the cell. A desirable change in activity can be the expression of the transfected gene. Another change in cell activity can be the induced production of a desired hormone or enzyme. Alternatively, a desirable change in activity can be the selective death of one cell type over another cell type. No limitation is placed on the relative change in cellular activity caused by the biologically active substance, providing the change is desirable and useful. Moreover, no limitation is placed on the cargo, providing the cargo induces a useful cellular response. Biologically active materials include cells, biomolecules (e.g., DNA, genes, peptides, proteins, enzymes, lipids, phospholipids, and nucleotides), natural or synthetic organic compounds (e.g., drugs, dyes, synthetic polymers, oligomers, and amino acids), inorganic materials (e.g., metals and metal oxides), radioactive variants of the foregoing, and combinations of the foregoing.

As a more specific example of therapeutic utility, the molded particles can comprise zero-valent gold metal in contact with a crosslinked hydrophobic binder (e.g., polystyrene)

for use in cancer therapy. Alternatively, the hydrophobic binder can be a biocompatible biodegradable polymer such as, for example a polycarbonate, polyester, and/or polyester-carbonate. As another example of utility, the molded particles can comprise a biocompatible biodegradable antimicrobial polymer. As another example of utility, the molded particles can comprise an anti-tumor drug in contact with a biocompatible biodegradable amphiphilic polycarbonate binder for controlled release of the drug.

The term "biodegradable" is defined by the American Society for Testing and Materials as degradation caused by biological activity, especially by enzymatic action, leading to a significant change in the chemical structure of the material. For purposes herein, a material is "biodegradable" if it undergoes 60% biodegradation within 180 days in accordance with ASTM D6400. Herein, a material is "enzymatically biodegradable" if the material can be degraded (e.g., depolymerized) by a reaction catalyzed by an enzyme.

A "biocompatible" material is defined herein as a material capable of performing with an appropriate host response in a specific application.

Exemplary diagnostic agents include without limitation imaging agents (e.g., iodinated compounds used in radiography and computed tomography (CT); magnetic ionic complexes of cobalt (e.g., $CoFe_2O_4$), gadolinium, iron, iron oxide, and manganese used in magnetic resonance imaging (MRI); and radioactive contrast enhancing agents containing technetium-99, iodine-123, and indium-87). In an embodiment, the disclosed particles comprise $CoFe_2O_4$ in contact with a crosslinked amphiphilic binder (e.g., styrene/acrylic acid copolymer).

FIGS. 1A to 1D are cross-sectional layer diagrams illustrating schematically a PRIOR ART method of forming a topographic patterned resist layer, which can serve as a template layer for forming molded particles. A positive tone resist is deposited on surface 12 of substrate 10 (FIG. 1A) to form an initial resist layer 14 of structure 20 (FIG. 1B). Optionally, initial resist layer 14 can be given a post-application bake (PAB). Pattern-wise exposure of the initial resist layer 14 using a suitable radiation source (not shown) produces exposed resist layer 32 (FIG. 1C, structure 30) composed of regions of non-crosslinked exposed resist 34 and non-crosslinked non-exposed resist 14. Optionally, exposed resist layer 32 is given a post-exposure bake (PEB). Positive tone development of the exposed resist layer 42 (e.g., using aqueous tetramethyl ammonium hydroxide solution (TMAH)) selectively removes exposed photoresist 34, thereby forming topographic patterned resist layer 42 (FIG. 1D, structure 40). Patterned resist layer 42 comprises regions of non-crosslinked non-exposed resist 14 and wells 48. Wells 48 have at least one sidewall 46 having height h. Sidewall 46 comprises non-crosslinked non-exposed resist 14. Wells 48 are also bounded by a bottom surface 44, which can be a substrate surface having essentially no non-crosslinked non-exposed resist 14 disposed thereon (as shown), or a bottom surface comprising non-crosslinked non-exposed resist 14 (not shown). Thus, sidewall 46 has a height h greater than 0 nm and preferably less than or about equal to the thickness of the patterned resist layer 42.

If desired, initial resist layer 14, exposed resist layer 34, and/or patterned resist layer 42 can be treated chemically, thermally and/or photochemically without crosslinking the resist.

FIG. 1E is an overhead angular view showing an array of wells 48 arranged in patterned resist layer 42. Each well 48 has one or more surrounding sidewalls 46 comprising non-crosslinked non-exposed resist 14. In this example wells 48 are rectangular, each having four sidewalls 46. Wells 48 can have any shape within the capability of the optical lithographic process used to form the topographic patterned layer. For example, wells 48 can have a cylindrical shape having a one circular surrounding sidewall 48 and a bottom surface 44.

Figure 2A:
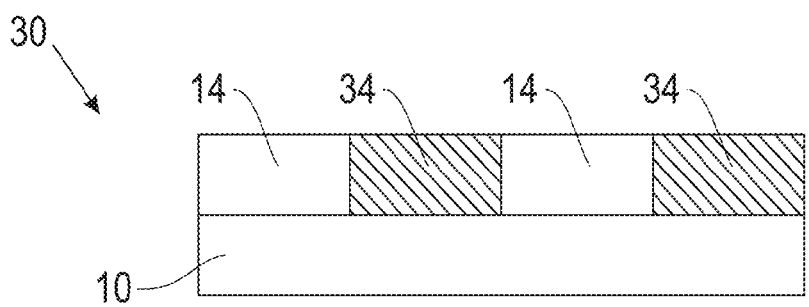
FIGS. 2A to 2B are schematic cross-sectional layer diagrams showing a second PRIOR ART method of forming a template layer.
Figure 2B:
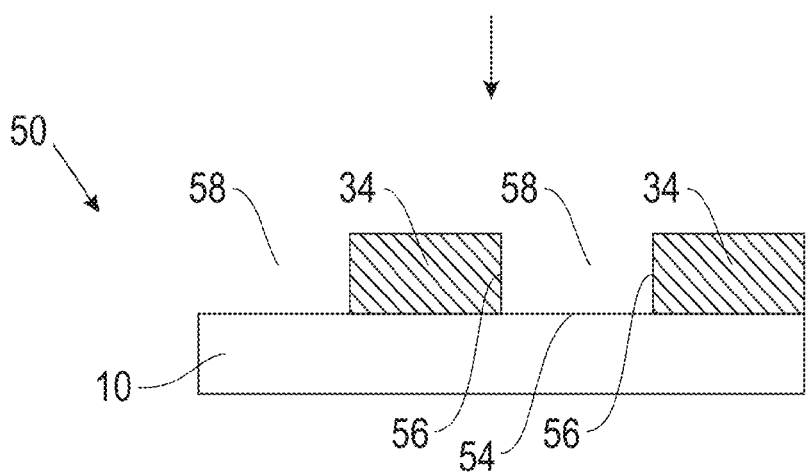

An alternative PRIOR ART method of forming a topographic patterned resist layer is shown in FIGS. 2A to 2B. Negative tone development (e.g., using an organic solvent developer) of the above-described structure 30 (shown as FIG. 2A) selectively removes non-exposed resist 14, thereby forming patterned resist layer 52 (FIG. 2B, structure 50). Patterned resist layer 52 comprises regions of non-crosslinked exposed resist 34 and wells 58 bounded by sidewalls 56 (comprising non-crosslinked exposed resist) and substrate surface 54 having essentially no resist disposed thereon.

Exemplary optical lithographic methods include double exposure lithography, interference lithography, and immersion lithography. In particular, the patternwise exposure used to form the template layer utilizes a radiation source emitting at a wavelength of about 10 nm to about 760 nm, more specifically about 10 nm to about 400 nm. In an embodiment, the patternwise exposure to form the template layer utilizes radiation of wavelength 248 nm and/or 193 nm.

Figure 3A:
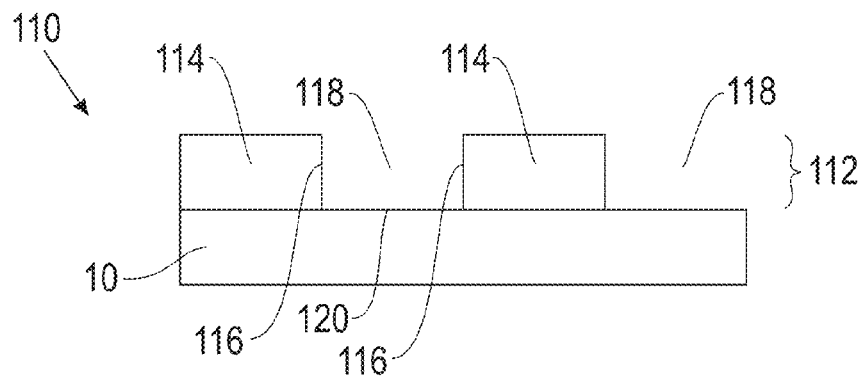
FIGS. 3A to 3E are schematic cross-sectional layer diagrams showing a first method of preparing the disclosed particles, in which a non-polar template polymer is subjected to a polarity switching treatment.
Figure 3B:
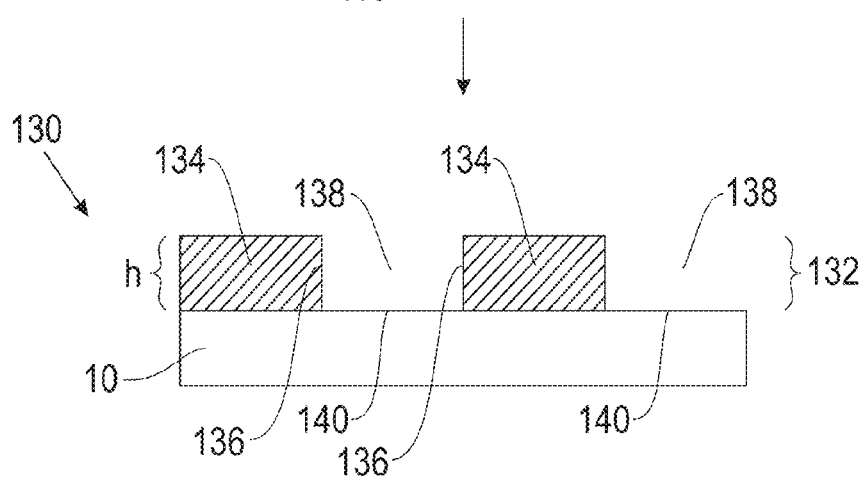

FIGS. 3A to 3E schematically illustrates a method of forming the disclosed particles. A structure 110 comprising template layer 112 disposed on a substrate 10 is provided using, for example, the above-described optical lithographic techniques (FIG. 3A). Template layer 112 comprises a non-polar non-crosslinked template polymer 114. In an embodiment, template layer 112 is formed using a positive-tone resist and positive tone development (e.g., developing with an aqueous base after a patternwise exposure and optional bake). In this instance, template polymer 114 is soluble in an organic solvent. Substrate 10 is a substrate suitable for spin casting (e.g., silicon, ceramic, and/or metal wafer), but not necessarily a substrate suitable for making a semiconductor device. Substrate 10 can comprise one or more layers. Template layer 112 is a topographical pattern comprising wells 118 bounded by sidewalls 116 and bottom surface 120. In this example, bottom surface 120 is a substrate surface having substantially no template polymer 114 disposed thereon. Sidewalls 116 comprise template polymer 114. In an embodiment, the template polymer 114 is a resist material that has not been exposed in a prior patternwise exposure. In this example, template layer 112 is subjected to a polarity switching treatment that increases the solubility of template polymer 114 in a given developer (e.g., aqueous TMAH) without crosslinking template polymer 114. The result is treated template layer 132 (FIG. 3B, structure 130) comprising treated template polymer 134 and wells 138. Treated template polymer 134 is not crosslinked. In an embodiment, treated template polymer 134 is insoluble in a particular organic solvent used for casting a formulation but soluble in a given aqueous and/or organic solution used for removing the template layer and particles from the substrate. Wells 138 are bounded by sidewalls 136 having height h and bottom surface 140. In this example, bottom surface 140 is a substrate surface having substantially no treated template polymer 134 disposed thereon. Wells 138 can have any suitable size and shape within the capability of the lithographic patterning process.

Figure 3C:
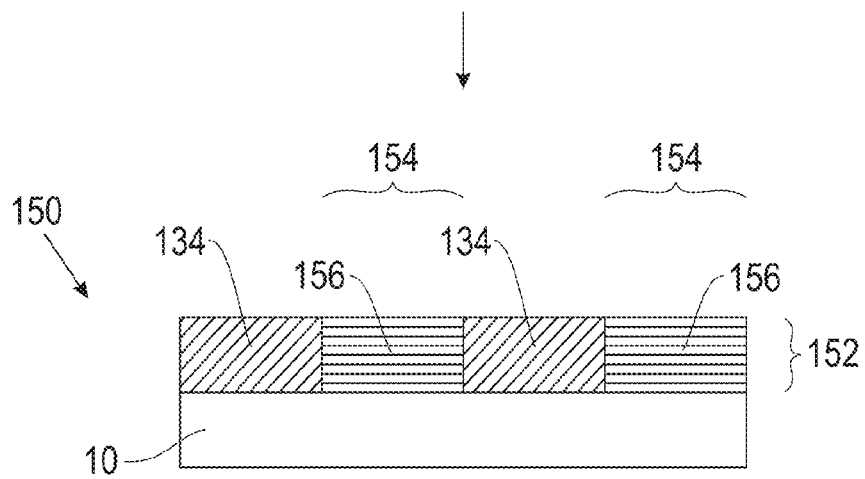
Figure 3D:
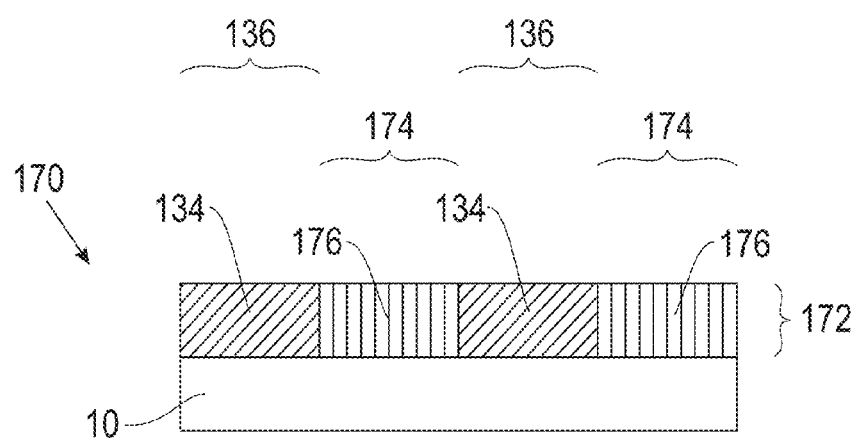
Figure 3E:
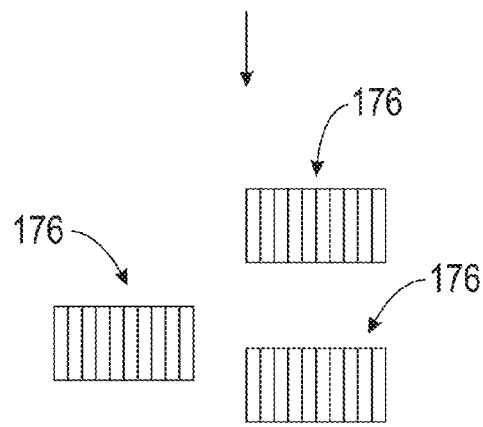

Each well 138 of structure 130 can serve as a mold for preparing a particle. A particle-forming composition, which is described in more detail further below, is cast onto treated template layer 132 without dissolving treated template polymer 134. The particle-forming composition is preferably essentially confined to wells 138. If the particle-forming composition contains a casting solvent (e.g., an organic solvent), the casting solvent can be removed using any suitable technique, leaving behind the particles disposed in the wells. The result is composite layer 152, which comprises non-crosslinked treated template polymer 134 and particles 154 (FIG. 3C, structure 150). Particles 154 can occupy the entire volume of wells 138 (shown) or a portion thereof (not shown). Particles 154 comprise a composition 156 that can include one or more components (e.g., a polymer binder, a crosslinking agent, and/or a medically useful substance). Particles 154 can be treated photochemically, thermally, and/or chemically, resulting in composite layer 172 comprising treated particles 174 and treated template polymer 134 (FIG. 3D, structure 170). Particles 174 are then isolated from treated template polymer 134 and substrate 10 (FIG. 3E). In an embodiment, composite layer 172 is stripped from substrate 10 using a suitable stripping agent (e.g., aqueous TMAH) that selectively dissolves treated template polymer 134 without dissolving particles 174. Particles 174 are then isolated from the resulting liquid mixture. In this manner, substrate 10 (e.g., a silicon wafer) can be recycled for continuous production of particles. Particles 174 can be collected using any suitable technique such as, for example, centrifugation and/or filtration.

The polarity altering treatment can be photochemical and/or thermal (e.g., a post-exposure bake (PEB)). As one example, non-crosslinked template polymer 114 can be soluble in a given organic solvent and insoluble in a given aqueous base, whereas non-crosslinked treated template polymer 134 can exhibit the opposite solubility characteristics in the organic solvent and aqueous base. In an embodiment, the treatment induces a chemical transformation that increases the concentration of polar functional groups in template polymer 114, rendering treated template polymer 134 insoluble in the given organic solvent without crosslinking template polymer 114.

A second method of forming the disclosed particles is illustrated in FIGS. 4A to 4D. A template layer 212 comprising a polar non-crosslinked template polymer 214 is provided on a substrate 10 using the above-described optical lithographic techniques (FIG. 3A, structure 110). For example, template layer 212 can be formed using a positive-tone resist and negative tone development (e.g., developing with an organic solvent after a patternwise exposure and optional bake to remove non-exposed resist). In this instance, template polymer 214 is soluble in an aqueous base. Template layer 212 is a topographical pattern comprising regions of non-crosslinked template polymer 214 and wells 218 bounded by sidewalls 216 and bottom surface 220. In this example, bottom surface 220 is a substrate surface having substantially no template polymer 214 disposed thereon. Wells 218 can have any suitable size and shape within the capabilities of the optical lithographic process.

Figure 4A:
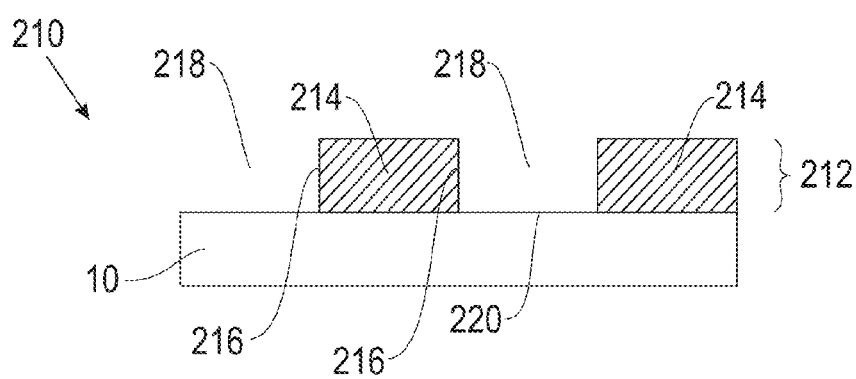
FIGS. 4A to 4D are schematic cross-sectional layer diagrams showing a second method of preparing the disclosed particles using a template layer comprising a template polymer that can be removed without subjecting the template polymer to a polarity switching treatment.
Figure 4B:
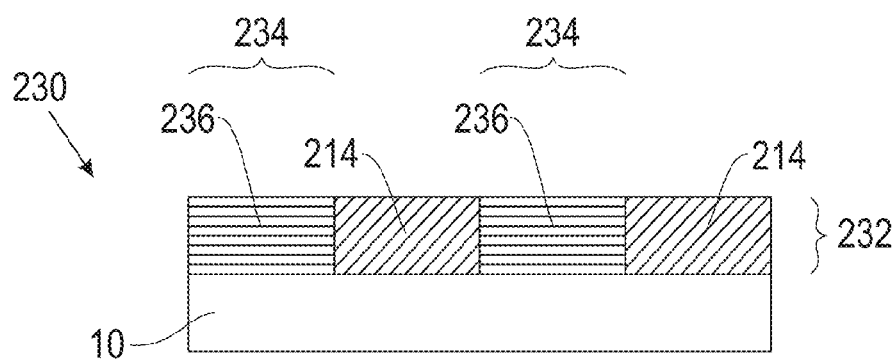
Figure 4C:
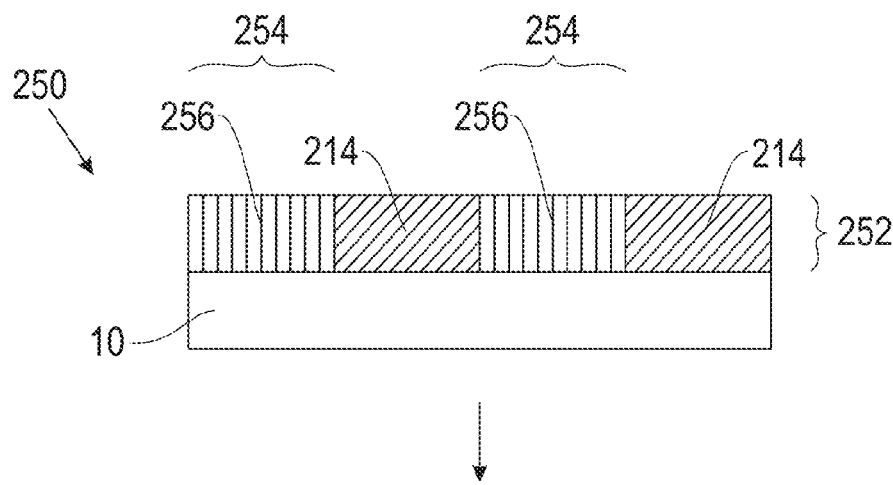
Figure 4D:
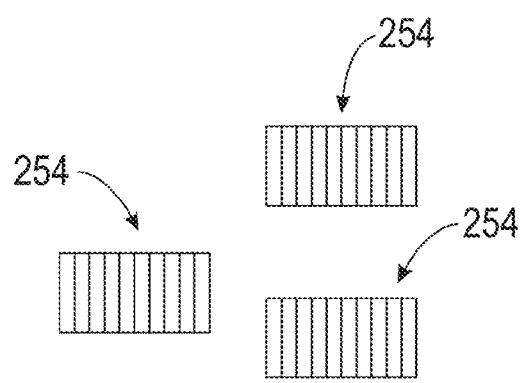

Structure 210 serves as a template for preparing particles. Each of wells 218 serves as a mold for forming a particle. A particle-forming composition is cast onto template layer 212 without dissolving template polymer 214. Optional removal of any solvent from the casted composition results in a composite layer 232 comprising non-crosslinked template polymer 214 and particles 234. The particles 234 are preferably essentially confined to the volume of wells 218 (FIG. 4B, structure 230). Particles 234 comprise a composition 236 that can include one or more components (e.g., a polymer binder, curing agent, and/or medically useful substance). Particles 234 can occupy the entire volume of wells 218 or a portion thereof. Particles 234 are optionally cured photochemically, thermally, and/or chemically, thereby forming composite layer 252 comprising treated particles 254 and template polymer 214 (FIG. 4C, structure 250). Particles 254 are then isolated from template polymer 214 and substrate 10 (FIG. 4D) using any suitable technique. For example, the entire composite layer 252 can be stripped from the substrate 10 using a developer capable of dissolving template polymer 214 without dissolving particles 254 (e.g., aqueous TMAH). The particles can then be collected by any suitable collection technique (e.g., centrifugation and/or filtration). Alternatively, template polymer 214 and particles 254 can be removed stepwise from the substrate. In an embodiment, template polymer 214 is removed selectively from composite layer 252 using a given aqueous and/or organic solution, while leaving particles 254 behind on substrate 10. In a subsequent step, particles 254 are removed from substrate 10 (e.g., by solvent stripping or another method of delamination). Substrate 10 can then be recycled to generate additional particles 254.

The particle forming composition can comprise sub-particles which assemble in the wells to form the particles. Thus, a particle can comprise an aggregate of sub-particles.

The particles can have a variety of shapes. Non-limiting exemplary shapes include a ring, a disc, a cylinder, and a hollow tube. In an embodiment, the particles have the shape of a ring. In another embodiment, the ring comprises an aggregate of sub-particles.

As indicated above, the topographic template layer is prepared using a template-forming material (e.g., positive-tone resist) that is compatible with the various semiconductor manufacturing processes used in forming a template layer, depositing a particle-forming composition on the template layer, and isolating the product particles. However, the template-forming material is not necessarily a material suitable for the manufacture of a semiconductor device. The example above using a positive-tone resist is merely illustrative of the options available for preparing a topographic template layer.

The term "substrate" refers to the structure on which the template layer is disposed. The substrate can have one or more layers arranged in a stack. The substrate is a material suitable for spin casting, typically a rigid wafer. The substrate can comprise a material selected from the group consisting of inorganic glasses, carbon, ceramics, metals, plastics, and combinations thereof. For example, the substrate can contain a Si-containing semiconductor material (i.e., a semiconductor material that includes Si). The substrate can comprise Si, SiGe, SiGeC, SiC, Ge alloys, GaAs, InAs, InP, as well as other III-V or II-VI compound semiconductors. The substrate can comprise a layered semiconductor such as Si/SiGe, and/or a semiconductor-on-insulator (SOI). The semiconductor material can be doped, undoped or contain both doped and undoped regions therein. The top surface of the substrate, can comprise inorganic or organic materials such as metals, carbon, and/or organic materials including organic polymers. For example, the substrate surface can comprise a silicon native oxide, silicon oxide, and/or silicon nitride.

Figure 4E:
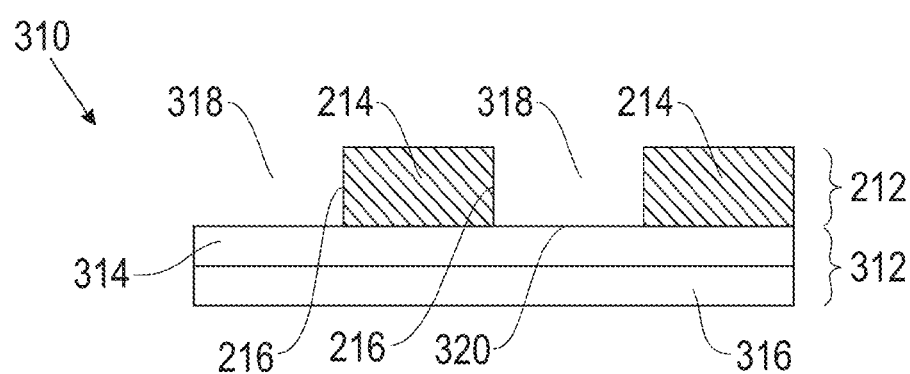
FIG. 4E is a cross-sectional layer diagram showing a template layer disposed on a multi-layered substrate. Top layer 314 of the substrate can serve as a release layer for the disclosed particles.

In a multi-layered substrate, the layer directly below and in contact with the template layer is the top layer of the substrate, also referred to herein as "the underlayer" to the template layer. The terms "surface" or "underlying surface" refer, unless otherwise stated, to the substrate surface on which the template layer is disposed. To illustrate, FIG. 4E shows layered structure 310 (similar to FIG. 4A) that comprises a multi-layered substrate 312 having a top layer 314 and a bottom layer 316. Template layer 212, comprising template polymer 214, is disposed on top layer 314, hence top layer 314 of substrate 312 is the underlayer to template layer 212. Surface 320 of top layer 314 is a bottom surface of wells 318.

Also shown are side walls 216 of wells 318. Top layer 314 can be a release layer for the disclosed particles.

As non-limiting examples, the template layer can be disposed on a surface of a silicon wafer, a metal foil, or more particularly on the surface of an anti-reflection layer (ARC) of a multi-layer substrate, in which case the ARC layer is the top-most layer of the substrate (i.e., the ARC layer is the underlayer of the template layer). The ARC layer can comprise a material that dissolves in aqueous tetramethylammonium hydroxide (TMAH), in which case the ARC layer can serve as a developable release layer for the template polymer and/or the disclosed particles. The substrate can comprise an ARC layer having a polymer brush layer disposed thereon, in which case the polymer brush layer is the underlayer for the template layer. The brush layer can potentially act as a release layer for the template layer and/or the particles.

A more specific example of an ARC layer is a silicon anti-reflective coating (Si-ARC). Examples of commercially available Si-ARC formulations suitable for forming a Si-ARC layer include, but are not limited to, Shin Etsu SHBA940, SHBA629, AZ S2H4, and any other commercially available silicon ARCs (or spin on hard mask) known to those familiar with the art. The Si-ARC may be formed by virtually any standard means including spin coating. Optionally, the substrate is baked after the Si-ARC is formed. The bake process can remove solvent from the Si-ARC layer and improve the coherence and uniformity of the Si-ARC layer. The bake process can also initiate a crosslinking reaction that renders the Si-ARC layer insoluble in the solvent for the template polymer. The preferred range of the bake temperature is from about 160° C. to about 250° C., more preferably from about 180° C. to about 210° C. The Si-ARC layer can be soluble in a mild etchant such as, for example, dilute HF, dilute HF containing ammonia, and/or carbon tetrafluoride ($CF_4$) dissolved in a suitable solvent. In this instance, the Si-ARC layer can serve as a release layer for the particles.

The substrate can comprise a spin on hard mask layer that is soluble in a mild etchant such as, for example, dilute HF, dilute HF containing ammonia, and/or carbon tetrafluoride ($CF_4$) dissolved in a suitable solvent. The hard mask layer can comprise any suitable hard mask material, such as an oxide, nitride, and/or oxynitride. The hard mask can be deposited by well known techniques such as chemical vapor deposition (CVD), plasma-assisted CVD, atomic layer deposition (ALD), evaporation, reactive sputtering, chemical solution deposition and other like deposition processes. The hard mask underlayer can serve as a release layer to facilitate the delamination of the disclosed particles after the template polymer has been removed.

Optionally, but not necessarily, the substrate can comprise an ARC layer disposed on a hard mask layer, in which case the ARC layer is the underlayer to the template layer.

The particle-forming composition comprises a polymer binder and/or a latent polymer binder (i.e., a monomer that undergoes polymerization in a well of the template layer to form a polymer binder). The polymer binder and/or a latent polymer binder can optionally undergo a crosslinking reaction to form a hardened particle. The polymer binder can have structural groups that separately exhibit hydrophilic, hydrophobic, and/or amphiphilic properties. The polymer binder can be biologically active (e.g., an antimicrobial cationic polycarbonate or polyestercarbonate formed by ring opening polymerization (ROP)).

The particle-forming composition can comprise a polymerizable monomer. Non-limiting examples of polymerizable monomers include polymerizable vinyl monomers (e.g., (meth)acrylate esters, acrylic acid, (meth)acrylamides, styrene, styrene sulfonic acids, and/or divinylbenzene), polyurethane-forming monomers (e.g., a mixture comprising a diisocyanate and diol), polyester forming monomer(s), and polycarbonate forming monomer(s). The polymerizable monomers can be used singularly or in combination.

The polymer binder can have a linear, block, branched, dendritic, and/or star polymer structure. Polymer binders can be used singularly or in combination. The polymer binder can be a synthetic polymer, a naturally occurring substance, and/or a derivative of a naturally occurring substance.

Non-limiting examples of synthetic polymer binders include homopolymers and copolymers of styrenes (e.g., poly(styrene), oxazolines (e.g., poly(oxazoline)), and (meth) acrylate esters. Synthetic hydrophilic polymer binders include polyvinyl alcohol, acrylamide polymers, maleic acid copolymers, poly(alkylene oxides) (e.g., poly(ethylene glycol)), acrylic acid polymers, methacrylic acid polymers, copolymers of the foregoing, and derivatives thereof. In an embodiment, the polymer binder is a copolymer of styrene and acrylic acid.

Other synthetic polymer binders include polycarbonates, polyesters, polyamides, and polycarbamates. In an embodiment, the polymer binder is a biocompatible biodegradable polymer formed by a step-growth polymerization method or a ring opening polymerization of a cyclic carbonyl monomer, preferably a cyclic carbonate monomer and/or cyclic ester monomer. In another embodiment, the polymer binder is formed by an organocatalyzed ring opening polymerization of a cyclic carbonate monomer and/or cyclic ester monomer.

Other exemplary polymer binders include hydrophilic colloid forming polymers derived from plant or animal tissue. Non-limiting examples include polysaccharides (e.g., cellulose, cellulose esters, starches, vegetable gums, zein, casein and pectin), proteins, derivatives of the foregoing, and combinations thereof. Exemplary starches include arrowroot, cornstarch, dextran, katakuri starch, potato starch, sago, and tapioca. Exemplary vegetable gums include agar, alginin, carrageenan, guar gum, locust bean gum, gum arabic and xanthan gum. Exemplary proteins include collagens, egg whites, and gelatins. The gelatin can be an alkali-treated gelatin (cattle bone or hide gelatin), an acid-treated gelatin (pigskin gelatin), and/or a gelatin derivative (e.g., acetylated gelatin, phthalated gelatin). Examples of suitable acrylic acid copolymers, methacrylic acid copolymers and polyalkylene oxides.

Other exemplary polymer binders include hydrogel forming polymers, more particularly those that form a hydrogel at a temperature of 15° C. to 45° C. The hydrogel can be a crosslinkable network or a self-supporting network held together by ionic and/or hydrophobic non-covalent interactions between independent polymer chains.

Cyclic Carbonyl Monomers for ROP

Non-limiting examples of cyclic carbonyl monomers for ring opening polymerizations include the cyclic carbonate monomers of Table 1.

TABLE 1

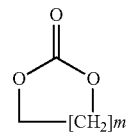

m = 1: Trimethylene carbonate (TMC)
m = 2: Tetramethylene carbonate (TEMC)
m = 3: Pentamethylene carbonate (PMC)

TABLE 1-continued
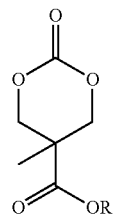
R = hydrogen (MTCOH)
R = methyl (MTCOMe)
R = t-butyl (MTCO$^t$Bu)
R = ethyl (MTCOEt)
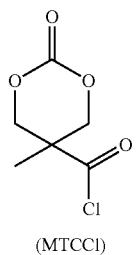
(MTCCl)
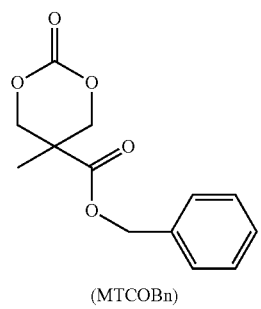
(MTCOBn)
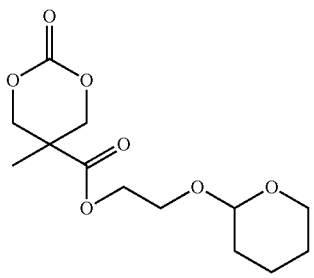 [SMILES: CC1(C(=O)OCCOC2CCCCO2)COC(=O)OC1]
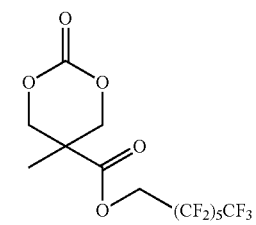
TABLE 1-continued
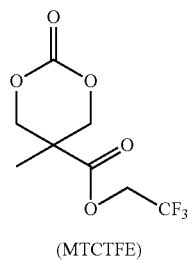 [SMILES: CC1(C(=O)OCC(F)(F)F)COC(=O)OC1]
(MTCTFE)
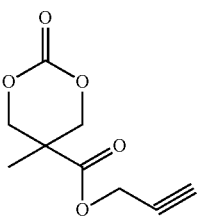
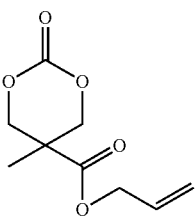
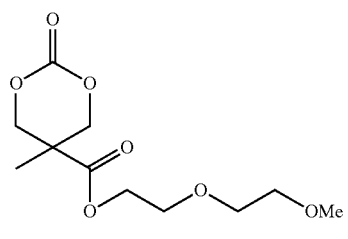 [SMILES: COCCOCCOC(=O)C1(C)COC(=O)OC1]
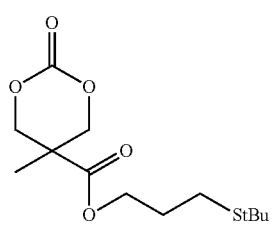
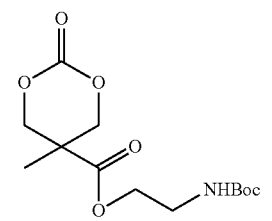 [SMILES: CC(C)(C)OC(=O)NCCOC(=O)C1(C)COC(=O)OC1]
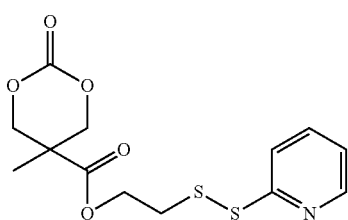 [SMILES: CC1(C(=O)OCCSSc2ccccn2)COC(=O)OC1]

TABLE 1-continued
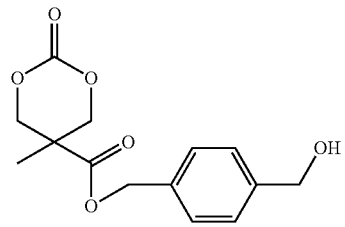 [SMILES: CC1(C(=O)OCc2ccc(CO)cc2)COC(=O)OC1]
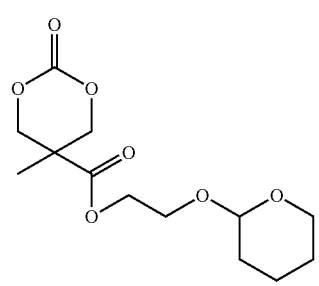 [SMILES: CC1(C(=O)OCCOC2CCCCO2)COC(=O)OC1]
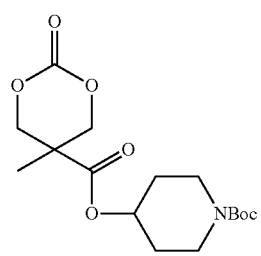 [SMILES: CC(C)(C)OC(=O)N1CCC(OC(=O)C2(C)COC(=O)OC2)CC1]
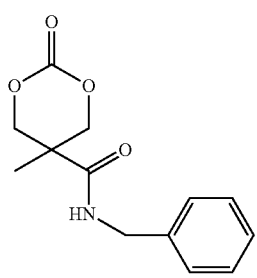 [SMILES: CC1(C(=O)NCc2ccccc2)COC(=O)OC1]
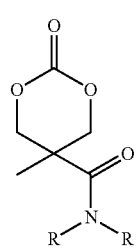
R = methyl
R = iso-propyl
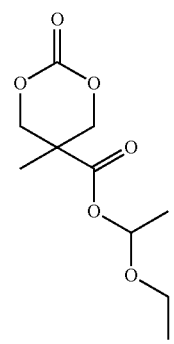
(MTCOEE)
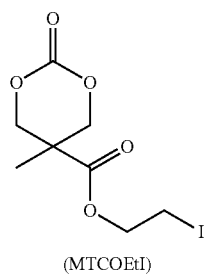
(MTCOEtI)
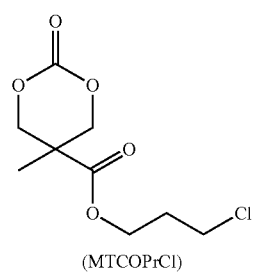
(MTCOPrCl)
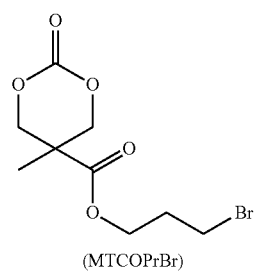
(MTCOPrBr)

TABLE 1-continued

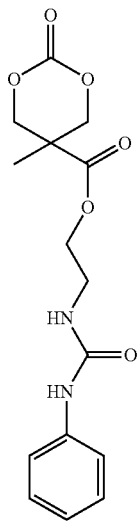

MTCU

Non-limiting examples of cyclic ester monomers include the compounds of Table 2, and stereospecific versions thereof where feasible.

TABLE 2

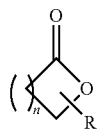

R = H; n = 1: beta-Propiolactone (b-PL)
R = H; n = 2: gamma-Butyrolactone (g-BL)
R = H; n = 3: delta-Valerolactone (d-VL)
R = H; n = 4: epsilon-Caprolactone (e-CL)
R = CH$_3$; n = 1: beta-Butyrolactone (b-BL)
R = CH$_3$; n = 2: gamma-Valerolactone (g-VL)

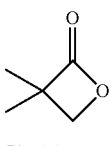

Pivalolactone
(PVL)

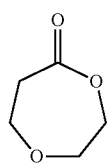

1,5-Dioxepan-2-one
(DXO)

TABLE 2-continued

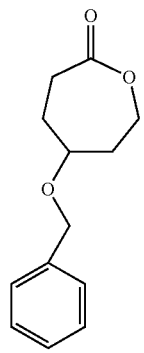

5-(Benzyloxy)oxepan-2-one
(BXO)

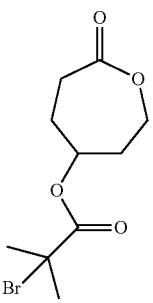

7-Oxooxepan-4-yl 2-bromo-2-methylpropanoate
(BMP-XO)

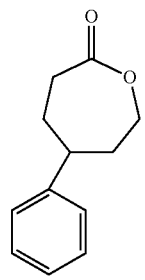

5-Phenyloxepan-2-one
(PXO)

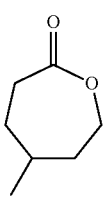

5-Methyloxepan-2-one
(MXO)

TABLE 2-continued

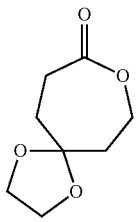

1,4,8-Trioxa(4,6)spiro-9-undecane
(TOSUO)

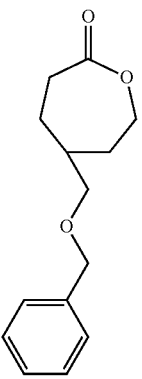

5-(Benzyloxymethyl)oxepan-2-one
(BOMXO)

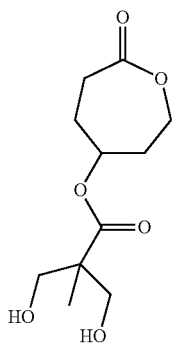

7-Oxooxepan-4-yl 3-hydroxy-2-
(hydroxymethyl)-2-methylpropanoate
(OX-BHMP)

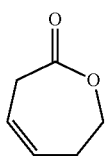

(Z)-6,7-Dihydrooxepin-2(3H)-one (DHXO)

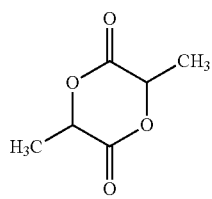

D-Lactide (DLA),
L-Lactide (LLA), or
racemic Lactide, 1:1 D:L forms (DLLA)

TABLE 2-continued

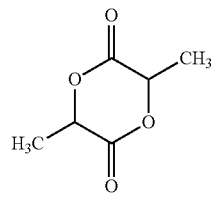

meso-Lactide (MLA)
(two opposite centers of asymmetry,

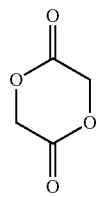

Glycolide (GLY)

The above monomers can be purified by recrystallization from a solvent such as ethyl acetate or by other known methods of purification, with particular attention being paid to removing as much water as possible from the monomer. The monomer moisture content can have a value of 1 to 10,000 ppm, 1 to 1,000 ppm, 1 to 500 ppm, and most specifically 1 to 100 ppm, by weight of the monomer.

ROP Initiators

The initiator for a ring opening polymerization (ROP) of a cyclic carbonyl monomer becomes a chain fragment of the product ROP polymer.

ROP initiators generally include nucleophiles such as alcohols, amines and thiols. The initiator can be monofunctional, difunctional, or multifunctional such as dendritic, polymeric or related architectures. Monofunctional initiators can include nucleophiles with protected functional groups that include protected thiols, protected amines, protected acids and protected alcohols. The alcohol initiator can be any suitable alcohol, including mono-alcohol, diol, triol, or other polyol, with the proviso that the choice of alcohol does not adversely affect the mechanical and physical properties of the product ROP polymer. The alcohol can also be multi-functional comprising, in addition to one or more hydroxyl groups, a halide, an ether group, an ester group, an amide group, and/or other functional group. Exemplary alcohols include methanol, ethanol, propanol, butanol, pentanol, amyl alcohol, capryl alcohol, nonyl alcohol, decyl alcohol, undecyl alcohol, lauryl alcohol, tridecyl alcohol, myristyl alcohol, pentadecyl alcohol, cetyl alcohol, heptadecyl alcohol, stearyl alcohol, nonadecyl alcohol and other aliphatic saturated alcohols, cyclopentanol, cyclohexanol, cycloheptanol, cyclooctanol and other aliphatic cyclic alcohols; phenol, substituted phenols, benzyl alcohol, substituted benzyl alcohol, benzenedimethanol, trimethylolpropane, saccharides, ethylene glycols, propylene glycols, hydroquinones, and resorcinols poly(ethylene glycol), propylene glycol, alcohol functionalized block copolymers derived from oligomeric alcohols, or alcohol functionalized branched polymers derived from branched alcohols, and combinations of the foregoing initiators.

A mono-nucleophilic poly(alkylene oxide) initiator (e.g., monomethyl poly(ethylene glycol)) can have a number average molecular weight (Mn) of 100 to 100,000, more preferably 100 to 10000, and even more preferably 1000 to 5000.

In an embodiment, the initiator is cyclic polyol capable of forming a star polymer by ring opening polymerization of a cyclic carbonyl monomer. A non-limiting example of a cyclic polyol is beta-cyclodextrin.

Other Components of the Particle Forming Composition

The particle-forming composition can also comprise a solvent, a surfactant, a crosslinking agent, a catalyst (e.g., to accelerate crosslinking, initiate a polymerization, and/or catalyze a reaction contributing to the formation of a particle), a photoacid generator (PAG), a photobase generator (PBG), a thermal acid generator (TAG), a thermal base generator (TBG), photoradical generator, a medically useful substance (e.g., a synthetic drug), and/or a biomolecule. The foregoing components can be used singularly or in combination with other like components. For example, the solvent can comprise water, one or more organic solvents, or combinations thereof.

If the particle-forming composition contains a casting solvent, the template polymer is substantially or completely insoluble in the casting solvent. Exemplary solvents include without limitation esters, ketones, hydrocarbons, ethyl lactate, lactones, cyclohexanone, alkyl ethers such as isoamyl ether, pentyl ether, hexyl ether, heptyl ether, octyl ether, benzyl ether and their derivatives; phenyl alkyl ethers such as phenyl methyl ether, phenyl ethyl ether, and their derivatives; benzoic esters such as methyl benzoate, ethyl benzoate, isopropyl benzoate, and their derivatives; propylene glycol derivatives such as propylene glycol methyl ether, propylene glycol propyl ether, and propylene glycol methyl ether acetate; aromatic solvents such as benzene and substituted benzenes including chlorobenzene, dichlorobenzene, o-xylene, m-xylene, and p-xylene, and combinations thereof.

Surfactants include ionic surfactants, which can be anionic, cationic, or zwitterionic. Exemplary anionic surfactants include the fluorinated and non-fluorinated carboxylates (e.g., perfluorooctanoates, perfluorodecanoates, perfluorotetradecanoates, octanoates, decanoates, tetradecanoates, fatty acid salts), the fluorinated and non-fluorinated sulfonates (e.g., perfluorooctanesulfonates, perfluorodecanesulfonates, octanesulfonates, decanesulfonates, alkyl benzene sulfonate), the fluorinated and non-fluorinated sulfate salts (e.g., dodecyl sulfates, lauryl sulfates, sodium lauryl ether sulfate, perfluorododecyl sulfate, and other alkyl and perfluoroalkyl sulfate salts). Specific examples of anionic surfactants include, but are not limited to, N-lauroylsarcosine sodium salt (also known as N-dodecanoyl-N-methylglycine sodium salt and sodium N-dodecanoyl-N-methylglycinate), polystyrene sulfonate (PSS), sodium dodecyl sulfate (SDS), sodium dodecyl sulfonate (SDSA), sodium dodecylallyl sulfosuccinate (TREM LF-40), sodium cholate (SC) and combinations thereof.

The majority of cationic surfactants contain a positively charged nitrogen atom, such as found in the quaternary ammonium surfactants, e.g., the alkyltrimethylammonium salts wherein the alkyl group typically possesses at least four carbon atoms and up to 14, 16, 18, 20, 22, 24, or 26 carbon atoms. Exemplary cationic surfactants include the quaternary ammonium surfactants (e.g., dodecyltrimethylammonium bromide (DTAB), cetyl trimethylammonium bromide (CTAB), cetyltrimethylammonium chloride (CTAC), benzalkonium chloride, and benzethonium chloride), the pyridinium surfactants (e.g., cetylpyridinium chloride), and the polyethoxylated amine surfactants (e.g., polyethoxylated tallow amine).

Exemplary zwitterionic surfactants include the betaines (e.g., dodecyl betaine, cocamidopropyl betaine) and the glycinates.

The surfactant can be non-ionic. Some examples of non-ionic surfactants include the alkyl polyethyleneoxides, alkylphenol polyethyleneoxides, copolymers of polyethyleneoxide and polypropyleneoxide (e.g., poloxamers and poloxamines), alkyl polyglucosides (e.g., octyl glucoside, decyl maltoside), fatty alcohols, (e.g., cetyl alcohol, oleyl alcohol), fatty amides (e.g., cocamide MEA, cocamide DEA), and polysorbates (e.g., polysorbate 20, polysorbate 40, polysorbate 60, polysorbate 80). Examples of nonionic surfactants include, but are not limited to, N-lauroylsarcosine or N-dodecanoyl-N-methylglycine, polyethylene glycol dodecyl ether, polyethylene glycol lauryl ether, polyethylene glycol hexadecyl ether, polyethylene glycol stearyl ether, and polyethylene glycol oleyl ether.

A photoacid generator (PAG) releases acid upon exposure to a radiation. Non-limiting PAGs include (trifluoro-methylsulfonyloxy)-bicyclo[2.2.1]hept-5-ene-2,3-dicarboximide (MDT); N-hydroxy-naphthalimide (DDSN); onium salts; benzoin tosylate; t-butylphenyl α-(p-toluenesulfonyloxy)-acetate; t-butyl α-(p-toluenesulfonyloxy)-acetate; sulfonic acid esters of N-hydroxyamides, imides, or combinations thereof; nitrobenzyl esters; s-triazine derivatives; N-camphorsulfonyloxynaphthalimide; N-pentafluorophenylsulfonyloxynaphthalimide; ionic iodonium sulfonates; perfluoroalkanesulfonates; aryl triflates; pyrogallol derivatives; trifluoromethanesulfonate esters of hydroxyimides; α,α'-bis-sulfonyl-diazomethanes; sulfonate esters of nitro-substituted benzyl alcohols; naphthoquinone-4-diazides; and alkyl disulfones.

Photobase generators (PBG) generate a base upon exposure to radiation. Photobase generators include quaternary ammonium dithiocarbamates, alpha aminoketones, oxime-urethane containing molecules such as dibenzophenone-oxime hexamethylene diurethane, ammonium tetraorganylborate salts, N-(2-nitrobenzyloxycarbonyl)cyclic amines, and combinations thereof.

A thermal acid generator (TAG) is capable of releasing or generating acid upon heating. Exemplary thermal acid generators include diaryl iodonium salts, sulfonate esters of oximes, sulfonate esters of benzyl alcohols, sulfonate esters of imides, N-allyl-N-dimethylanilinium hexafluoroantimonate salts, and N-crotyl-N-dimethylanilinium hexafluoroantimonate salts, and sulfonic ester compounds such as cyclohexyl p-toluenesulfonate, cyclohexyl propanesulfonate, cyclohexyl methanesulfonate, cyclohexyl octanesulfonate, cyclohexyl camphorsulfonate, and combinations thereof.

A thermal base generator (TBG) forms a base upon heating. The thermal base generator can comprise a functional group selected from the group consisting of amide, sulfonamide, imide, imine, O-acyl oxime, benzoyloxycarbonyl derivative, quarternary ammonium salt, nifedipine, carbamate, and combinations thereof. Exemplary thermal base generators include o-{(.beta.-(dimethylamino)ethyl)aminocarbonyl}benzoic acid, o-{(.gamma.(dimethylamino)propyl)aminocarbonyl}benzoic acid, 2,5-bis{(.beta.(dimethylamino)ethyl)aminocarbonyl}terephthalic acid, 2,5-bis{(.gamma.(dimethylamino)propyl) aminocarbonyl}terephthalic acid, 2,4-bis{(.beta.(dimethylamino)ethyl)aminocarbonyl}isophthalic acid, 2,4-bis {(.gamma.(dimethylamino)propyl) aminocarbonyl}isophthalic acid, and combinations thereof.

A photoradical generator generates radicals upon exposure to radiation. Photoradical generators include alpha,alpha-dimethoxy-alpha-phenylacetophenone, alpha-hydroxy-alpha, and alpha-dimethylacetophenone.

Therapeutic Agents

Medically useful substances that are therapeutic agents include without limitation anti-inflammatory agents, anti-cancer agents, immunosuppressants, antiviral agents, antibiotics, steroids, and hormones. The therapeutic agents can be polymeric or non-polymeric. The medically useful substances can be present in the particles singularly or in combination. In the following description, therapeutic agents are identified by their generic names.

Anti-inflammatory agents include non-steroidal and steroidal anti-inflammatory drugs. Exemplary non-steroidal anti-inflammatory drugs (NSAIDs) include without limitation acetaminophen, apricoxib, aspirin, celecoxib, dexibuprofen, dexketoprofen, diclofenac, diflunisal, Disalcid, droxicam, etodolac, etoricoxib, fenoprofen, firocoxib, flufenamic acid, flurbiprofen, hyperforin, ibuprofen, indomethacin, isoxicam, ketoprofen, ketorolac, licofelone, lornoxicam, loxoprofen, lumiracoxib, lysine clonixinate, meclofenamate, meclofenamic acid, mefenamic acid, meloxicam, mefenamic acid, nabumetone, naproxen, nimesulide, oxaprozin, oxyphenthatrazone, parecoxib, phenylbutazone, piroxicam, rofecoxib, sulfasalzine, salsalate, sulindac, tenoxicam, tolfenamic acid, tolmetin, valdecoxib.

Steroidal anti-inflammatory compounds include betamethasone, betamethasone dipropionate, betamethasone valerate, clobetasol propionate, clobetasone, clobetasone butyrate, cortisol, cortisone, difluocortolone valerate, fludrocortisone, hydrocortisone, hydrocortisone 17-butyrate, methylprednisolone, methylprednisolone aceponate, mometasone furoate, prednisone, triamcinolone, and triamcinolone acetonide.

Exemplary anti-cancer compounds include without limitation alkylating agents (e.g., bendamustine, busulfan, carboplatin, carmustine, chlorambucil, cisplatin, cyclophosphamide, dacarbazine, ifosfamide, lomustine, melphalan, mechlorethamine, oxaliplatin, streptozocin, temozolomide, and thiotepa), anti-metabolites (e.g., capecitabine, cladribine, cytarabine, decitabine, floxuridine, fludarabine, fluorouracil, gemcitabine, hydroxyurea, mercaptopurine, methotrexate, nelarabine, pemetrexed, pralatrexate, and thioguanine), antibiotic anti-neoplastic agents (e.g., bleomycin, dactinomycin, daunorubicin, doxorubicin, epirubicin, idarubicin, mitomycin, mitoxantrone, pentostatin, plicamycin, and valrubicin), and mitotic inhibitors (e.g., cabazitaxel, docetaxel, eribulin, estramustine, etoposide, ixabepilone, paclitaxel, teniposide, vinblastine, vincristine, and vinorelbine), anti-neoplastic detoxifying agents (e.g., amifostine and mesna), and other anti-tumor drugs (e.g., aldesleukin, altretamine, abiraterone, arsenic trioxide, azacitidine, bexarotene, denileukin diftitox, irinotecan, isotretinoin, isotretinoin, lenalidomide, levamisole, mitotane, pegasparagase, procarbazine, porfimer, thalidomide, topotecan, tretinoin, and verteporfin).

Non-limiting immunosuppressants include abatacept, alefacept, belimumab, belatacept, efalizumab, everolimus, fingolimod, leflunomide, mycophenolate mofetil, mycophenolic acid, muromonab-cd3, natalizumab, eculizumab, and sirolimus.

Exemplary antiviral agents include without limitation abacavir, acyclovir, adefovir, amantadine, amprenavir, atazanavir, boceprevir, cidofovir, darunavir, delavirdine, didanosine, efavirenz, emtricitabine, enfuvirtide, entecavir, etravirine, famciclovir, fomivirsen, fosamprenavir, foscarnet, ganciclovir, indinavir, lamivudine, maraviroc, nelfinavir, nevirapine, oseltamivir, raltegravir, ribavirin, rilpivirine, rimantadine, ritonavir, saquinavir, stavudine, teleprevir, telbivudine, tenofovir, tipranavir, valacyclovir, valganciclovir, zalcitabine, zanamivar, and zidovudine. Exemplary antiviral drug combinations include abacavir/lamivudine, abacavir/lamivudine/zidovudine, efavirenz/emtricitabine/tenofovir, emtricitabine/nelfinavir/tenofovir, emtricitabine/lopinavir/ritonavir/tenofovir, emtricitabine/rilpivirine/tenofovir, emtricitabine/tenofovir, interferon alfa-2b/ribavirin, and lamivudine/zidovudine.

Exemplary antibiotics include without limitation amikacin, amoxicillin, ampicillin, atovaquone, azitromycin, azlocillin, aztreonam, bacitracin, benzatinpenicillin, benzylpenicillin, cefaclor, cefadroxil, cefalexin, cefalotin, cefamandol, cefepim, cefazolin, cefetamet-pivoxil, cefixim, cefoperazon, cefotaxim, cefoxitin, cefpirom, cefpodoxim-proxetil, ceftazidim, ceftibuten, ceftriaxon, cefuroxim, cefuroxim-axetil, chloramphenicol, ciprofloxacin, claritromycin, clindamycin, cloxacillin, colistimethate, daptomycin, dicloxacillin, doxycycline, erythromycin, gentamicin, imipenem, isepamicin, josamycin, karbenicillin, lincomycin, linezolid, mafenide, meropenem, methicillin, metronidazole, mezlocillin, metronidazol, minocycline, mupirocin, nafcillin, nalidix acid, netilmicin, norfloxacin, ofloxacin, ornidazole, oxacillin, oxolinic acid, oxytetracycline, pentamidine, pefloxacin, phenoxymethylpenicillin, pipemidic acid, piperacillin, procainpenicillin, retapamulin, rifaximin, roxitromycin, silver sulfadiazine, sodium sulfacetamide, spectinomycin, spiramycin, streptomycin, teicoplanin, tetracycline, ticarcillin, tinidazole, tobramycin, trimethoprim, trimetrexate, and vancomycin.

Non-limiting antibiotic drug combinations include bacitracin/neomycin/polymyxin-b, bacitracin/polymyxin-b, dalfopristin/quinupristin, erythromycin/sulfisoxazole, neomycin/polymyxin-b/pramoxine, sodium sulfacetamide/sulfur, and sulfamethoxazole/trimethoprim.

Exemplary steroid therapeutic agents include but are not limited to beclomethasone, betamethasone, budesonide, ciclesonide, clobetasol, corticotropin, cosyntropin, desonide, desoximetasone, dexamethasone, diflorasone, difluprednate, flunisolide, fluocinonide, fluocinolone, fluorometholone, fluoxymesterone, fluticasone, halcinonide, halobetasol, hydrocortisone, loteprednol, mometasone, nandrolone decanoate, nandrolone phenpropionate, methyltestosterone, danazol, fluocinolone, fluoxymesterone, methandrostenolone, methyltestosterone, mometasone, oxandrolone, oxymetholone, prednisolone, rimexolone, stanozolol, T propionate, T enanthate, T cypionate, testosterone, triamcinolone.

The particle-forming composition can include a biomolecule. Biomolecules include without limitation DNA, RNA, siRNA, proteins, peptides, enzymes, carbohydrates, and glycoproteins.

An optional post-application bake (PAB) can be performed after disposing the particle-forming composition on the non-crosslinked template layer. The PAB can be conducted at a temperature from 40° C. to 300° C. for a period of 1 second to 24 hours. The particle-forming composition can be coated onto the non-crosslinked template layer using a spin-coating process to form molded particles with the shape and size of the wells.

In an embodiment, following the application of the particle-forming composition via spin coating to form molded particles, the casted particle-forming composition (e.g., particle-forming polymer and/or particle-forming polymerizable monomer) can be treated photochemically, thermally, and/or chemically in order to crosslink the particle-forming material. Many suitable crosslinking reactions are known to those skilled in the art. Representative classes of crosslinking reactions include radical crosslinking, thiol-ene reactions, Huisgen cycloadditions, Diels-Alder reactions, esterification, amidation, imine-formation, oxime formation, hydrazone formation, acetal formation, ketal formation, and/or Michael addition reactions. A catalyst can be included among the precursors to accelerate the crosslinking reaction.

An optional post-treatment bake can be performed following the photochemical, thermal, and/or chemical treatment step. The bake can be conducted at a temperature from 40° C. to 300° C. for a period of 1 second to 24 hours.

The composite layer comprising the molded particles and the template polymer are preferably removed simultaneously from the substrate by rinsing the composite layer with a suitable solvent. The solvent acts to dissolve the non-crosslinked template polymer and delaminate the particles from the substrate. Exemplary solvents include polar solvents such as dimethylsulfoxide and alcohol solvents. Other solvents include aqueous solutions including alkaline aqueous solutions (e.g., TMAH).

Alternatively, the molded particles and the template polymer can be removed in separate steps. For example, the template polymer can be removed first using an alkaline aqueous developer solution such as 0.26 N aqueous tetramethylammonium hydroxide (TMAH). The molded particles can be removed subsequently using a suitable organic solvent that facilitates delamination of the particles.

The following examples demonstrate processes useful in forming the disclosed particles.

EXAMPLES

Materials used in the following examples are listed in Table 1.

TABLE 1

| NAME | DESCRIPTION | SOURCE |
|---|---|---|
| HAuCl4 | Hydrogen Tetrachloro Aurate(III) | Aldrich |
| $PAA_{33}$-b-$PS_{340}$ | Polyacrylic Acid-b-Polystyrene Block Copolymer Mw: 37000; PDI: 1.06 | |
| Fe(acac)$_3$ | Iron(III) Acetylacetonate | Aldrich |
| Co(acac)$_2$ | Cobalt(II) Acetylacetonate | Aldrich |
| JSR2073 | 193 nm Positive Tone Resist | JSR |
| PS | Poly(styrene); Mn 45,000 | Aldrich |
| DAROCUR-1173 | 2-Hydroxy-2-methyl-1-phenyl-propan-1-one; photoinitiator | BASF |
| b-CD | Beta-Cyclodextrin | Aldrich |
| TU | N-bis(3,5-trifluoromethyl)phenyl-N'-cyclohexyl-thiourea | See paragraph 86 |
| LLA | L-Lactide | Aldrich |
| MMA | Methacrylic Anhydride | Aldrich |
| PGMEA | Propylene Glycol Methyl Ether Acetate | Aldrich |

Herein, Mn is the number average molecular weight, Mw is the weight average molecular weight, and MW is the molecular weight of one molecule.

N-bis(3,5-trifluoromethyl)phenyl-N'-cyclohexyl-thiourea (TU) was prepared as reported by R. C. Pratt, B. G. G. Lohmeijer, D. A. Long, P. N. P. Lundberg, A. Dove, H. Li, C. G. Wade, R. M. Waymouth, and J. L. Hedrick, Macromolecules, 2006, 39 (23), 7863-7871, and dried by stirring in dry THF over CaH$_2$, filtering, and removing solvent under vacuum.

$PAA_{33}$-b-$PS_{340}$ was prepared according to the procedure of Liu, G. et al., Chem. Mater. 2005, 17, 4985-4991.

Example 1

Formation of polystyrene-coated gold nanoparticles (referred to as Au@PS). For clarity, these nanoparticles are referred to as sub-particles because they are used to form the disclosed particles. All glassware was cleaned with 1% aqueous HCl solution three times, rinsed with distilled water, and then oven-dried prior to use. Colloidal gold sub-particles with an average diameter of 20 nm were prepared by rapidly injecting a sodium citrate solution (1.5 mL, 38.8 mM) into a boiling aqueous solution of HAuCl4 (100 mL, 0.35 mM) with vigorous stirring. After 20 minutes of continued boiling, the solution was removed from the heat and allowed to cool to room temperature. As a representative procedure for forming a polymer-stabilized gold sub-particle, thiol-terminated polystyrene (5 mg) was dissolved in 10 mL of THF and then mixed with 50 mL of an aqueous solution of citrate-coated gold sub-particles in a 250 mL reparatory funnel. Chloroform (25 mL) was then added, resulting in immediate separation of the organic and aqueous phases. The red-purple colored organic layer containing the polystyrene-coated gold sub-particles was isolated, and the organic solvents removed under reduced pressure. The polystyrene-coated gold sub-particles were washed with cyclohexane twice to remove the residual unreacted polymers.

Example 2

Formation of polystyrene-b-polyacrylic acid stabilized cobalt ferrite nanoparticles (referred to as CoFe$_2$O$_4$@PS-b-PAA). For clarity, these nanoparticles are also referred to as sub-particles because they are used to form the disclosed particles. 18 nm ferrimagnetic CoFe$_2$O$_4$ sub-particles were prepared following a procedure reported by Sun et al., J. Am. Chem. Soc. 2004, 126, 273-279. Accordingly, Fe(acac)$_3$ (2 mmol), Co(acac)$_2$ (1 mmol), 1,2-hexadecanediol (10 mmol), oleic acid (6 mmol), oleylamine (6 mmol), and benzyl ether (20 mL) were combined in a first mixture and mechanically stirred under a flow of nitrogen. The mixture was heated to 200° C. for 2 hours and then, under a blanket of nitrogen, heated to reflux (~300° C.) for 1 hour. The black colored mixture was cooled to room temperature. Ethanol (40 mL) was added to the mixture at ambient temperature, and a black material was precipitated and separated via centrifugation at 6000 rpm for 10 minutes. The black precipitate was dissolved in hexane containing 0.1% by volume oleic acid. The mixture was centrifuged at 6000 rpm for 10 minutes to remove any non-dispersed residue. The product was then precipitated with ethanol, centrifuged to remove the solvent, and dried in vacuum overnight. The average diameter of the CoFe$_2$O$_4$ sub-particles was 6 nm with a narrow size distribution. The as-synthesized 6 nm CoFe$_2$O$_4$ sub-particles were further used as seeds to grow larger sub-particles. A second reaction mixture was formed containing Fe(acac)$_3$ (2 mmol), Co(acac)$_2$ (1 mmol), 1,2-hexadecanediol (10 mmol), oleic acid (2 mmol), oleylamine (2 mmol), and benzyl ether (20 mL) with mixing and mechanically stirring under a flow of nitrogen. The above prepared solution (6 mL) containing CoFe$_2$O$_4$ sub-particles (6 nm) in hexane solution (15 mg/mL) was then added to the second reaction mixture. The resulting third mixture was first heated at 100° C. for 30 minutes to remove hexane, and then heated at 200° C. for 1 hour. Under a blanket of nitrogen, the third mixture was further heated at 300° C. for 30 minutes. Following the same workup procedures, mono-dispersed CoFe$_2$O$_4$ sub-particles having a diameter of 15 nm were obtained. Finally, the seed mediated growth method was repeated again to prepare 18 nm mono-dispersed $CoFe_2O_4$ ferrimagnetic sub-particles.

The diblock copolymer-stabilized $CoFe_2O_4$ ferrimagnetic sub-particles were prepared using the following procedure. In a glass container under ambient conditions, 1 mL of $PAA_{33}$-b-$PS_{340}$ (Mw: 37000; PDI: 1.06) in THF solution (10 mg/mL) was added to a dispersion of above synthesized 18 nm oleic acid-coated $CoFe_2O_4$ ferrimagnetic sub-particles (10 mg in 10 mL THF). The resulting mixture was stirred magnetically for 18 hours at room temperature. The CoFe2O4@PS-b-PAA sub-particles were separated using a magnet, the solvent was removed using a pipette, and the sub-particles were redispersed in propylene glycol methyl ether acetate (PGMEA) solvent.

Example 3

Formation of contact hole patterns. A solution comprising a 193 nm photoresist (JSR2073) was spin-coated onto a substrate having an anti-reflection layer coating (780 angstroms of ARC29A, Brewer Science) on silicon. The photoresist layer was baked at 110° C. for 60 seconds, patternwise exposed using 193 nm optical lithography, and post exposure baked at 110° C. for 60 seconds. This was followed by a 30 second puddle development step with 0.26 N TMAH developer to resolve 0.25 micrometer contact hole features.

Example 4

Formation of contact hole patterns using double exposure. A solution comprising a 193 nm photoresist was spin-coated onto a substrate having an anti-reflection layer coating (350 angstroms SiARC) on silicon. The photoresist layer was patternwise exposed using 193 nm optical lithography with a reticle comprised of line/space arrays, rotated 90 degrees, and then patternwise exposed again with the same reticle. The exposed layer was developed with anisole to form a contact hole array pattern. The holes had a width of 100 nm.

Example 5

Filling of lithographically patterned holes with polymer-coated sub-particles. The polymer-coated sub-particles, such as the representative sub-particles from Examples 1 and 2, in PGMEA (4.5 mg/mL) were spin-coated onto lithographically patterned substrates (2.0 cm×2.0 cm). In general, the substrates were spin-coated for 30 seconds at 3000 rpm. In some cases, the substrates were then irradiated with a 254 nm UV lamp for 10 min to crosslink the polystyrene shell. The substrates were then dipped into TMAH developer aqueous solution (0.26 N) for 10 seconds to remove the photoresist patterns. Longer exposure to the developer solution enabled the removal of the particles from the surface.

Figure 5:
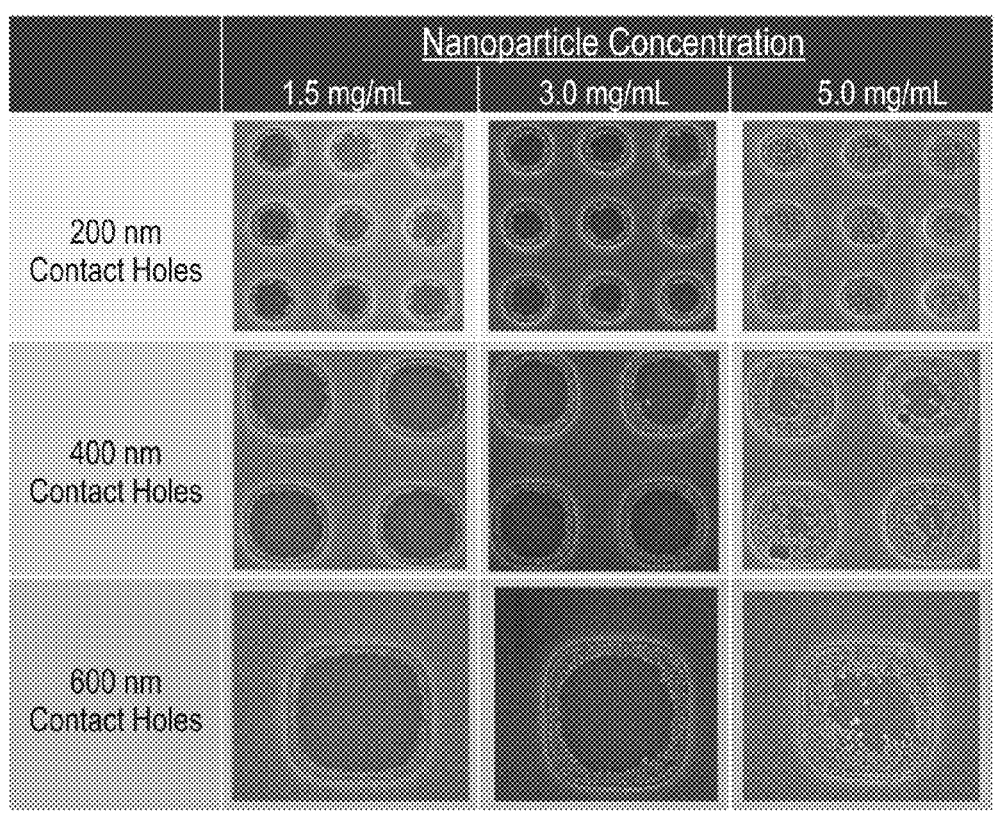
FIG. 5 is a set of SEM photographs showing the relationship between the size of the holes of the hole array of Example 5 and the concentration of the diblock copolymer-coated $CoFe_2O_4$ sub-particles of Example 2 used to coat the hole array. At a concentration of 3 mg/mL the sub-particles form a ring shaped particle in each of the different sized holes. The rings appear as aggregates of the 18 nm sub-particles.

FIG. 5 is a set of SEM photographs showing the relationship between the size of the holes of the hole array, and polymer-coated sub-particle concentration used to coat the hole array. The contact holes had a circular diameter of 200 nm, 400 nm, and 600 nm. The polymer-coated sub-particle concentration was 1.5 mg/mL, 3.0 mg/mL, and 5.0 mg/mL. The concentration series shows the polymer-coated sub-particles of Example 2 filled in the holes from the outermost edge of the hole first to the center of the hole last. As shown, the sub-particles can form a particle having the shape of a ring. The ring particle appears as an aggregate of the sub-particles.

Figure 6:
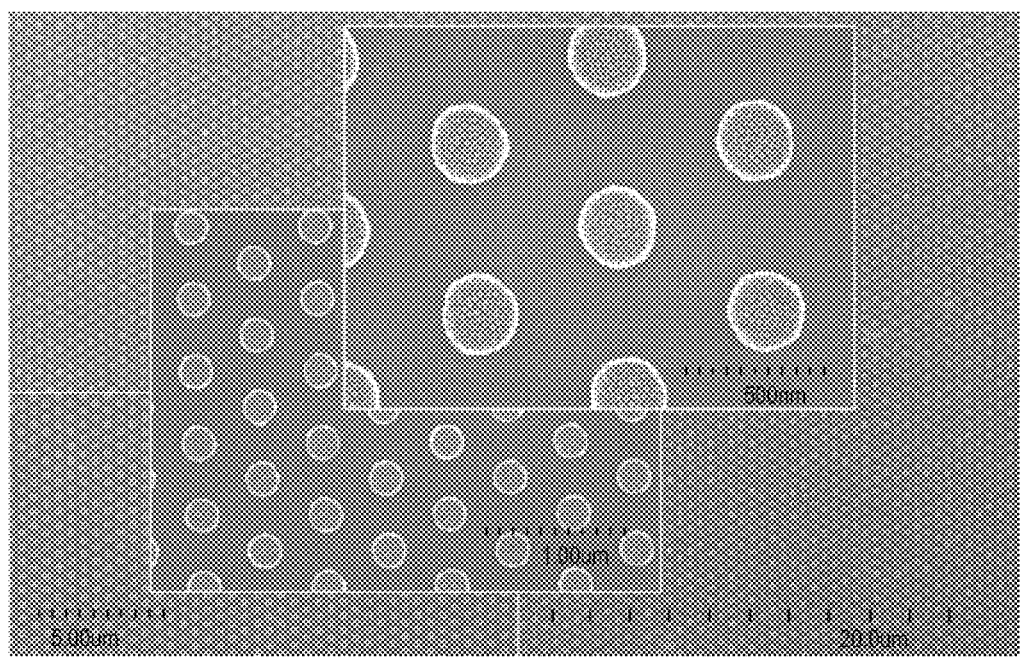
FIG. 6 is a set of SEM photographs showing a 200 nm hole array pattern in Example 5 filled with the polymer-coated sub-particles of Example 2 at several magnification levels.

FIG. 6 is a set of SEM photographs showing a 200 nm hole array pattern filled with the polymer-coated sub-particles of Example 2 at several magnification levels. The particles appear as aggregates of the sub-particles.

Example 6

Filling of lithographically patterned holes with poly(styrene). Polystyrene (0.7 wt % in PGMEA) was spin-coated onto lithographically patterned substrates (2.0 cm×2.0 cm) having a 200 nm hole pattern. In general, the substrates were spin-coated for 30 seconds at 2000 rpm. In some cases, the substrates were then irradiated with a 254 nm UV lamp for 10 minutes to crosslink the polystyrene. The substrates were then dipped into TMAH developer aqueous solution (0.26 N) for 10 seconds to remove the photoresist patterns. Longer exposure to the developer solution enabled the removal of the particles from the surface.

Figure 7A:
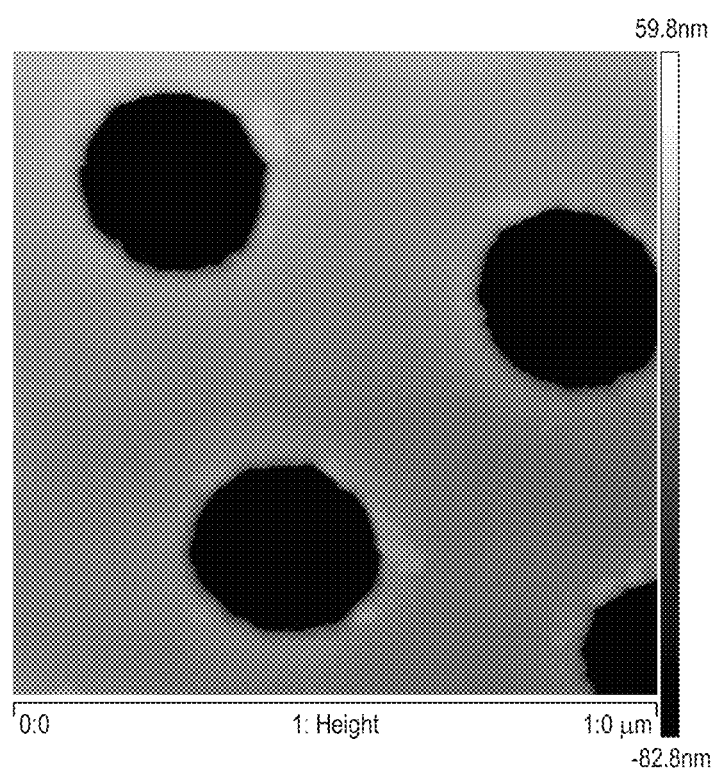
FIG. 7A is an atomic force microscope (AFM) image of a 200 nm hole pattern before filling the holes with polystyrene (Example 6).
Figure 7B:
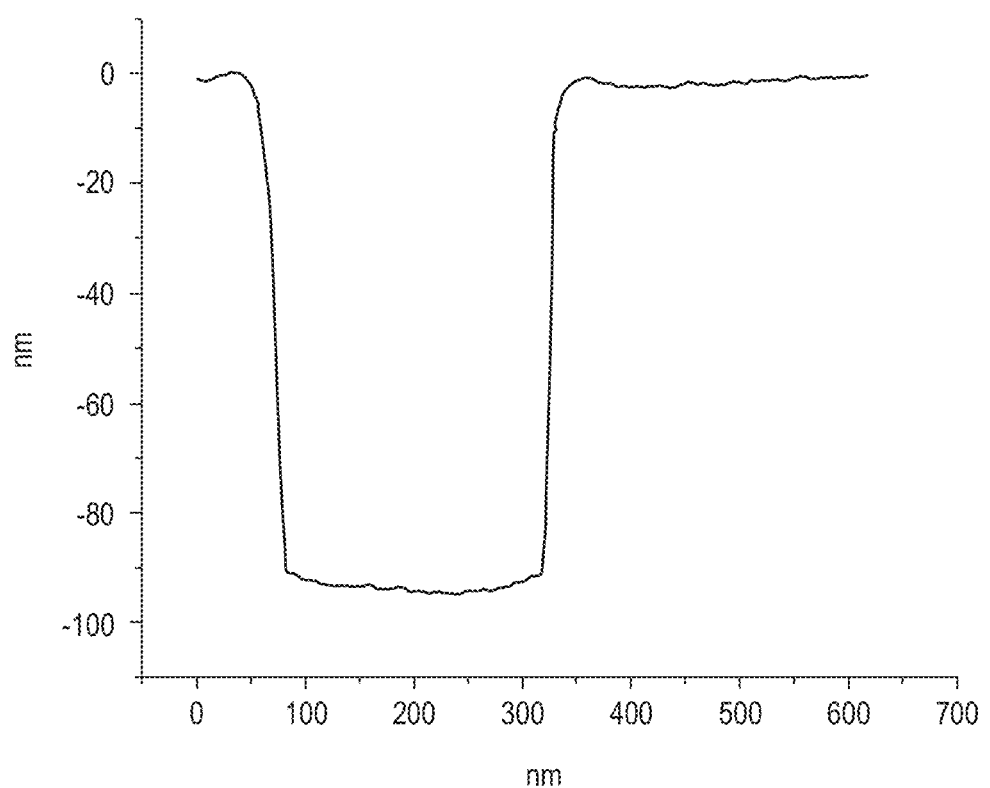
FIG. 7B is a graph showing the depth profile of a 200 nm hole of FIG. 7A.

FIG. 7A is an atomic force microscope (AFM) image of a 200 nm hole pattern before filling the holes with polystyrene. FIG. 7B is a graph showing the depth profile of a 200 nm hole of FIG. 7A.

Figure 7C:
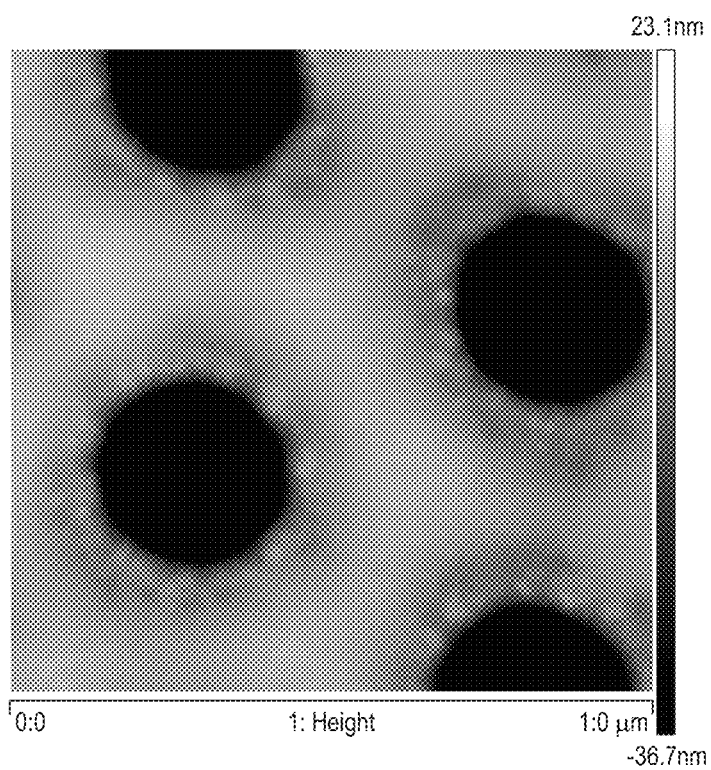
FIG. 7C is an AFM image of the 200 nm hole pattern of Example 6 after filling the holes with polystyrene using a 0.8 wt % solution of polystyrene in PGMEA.
Figure 7D:
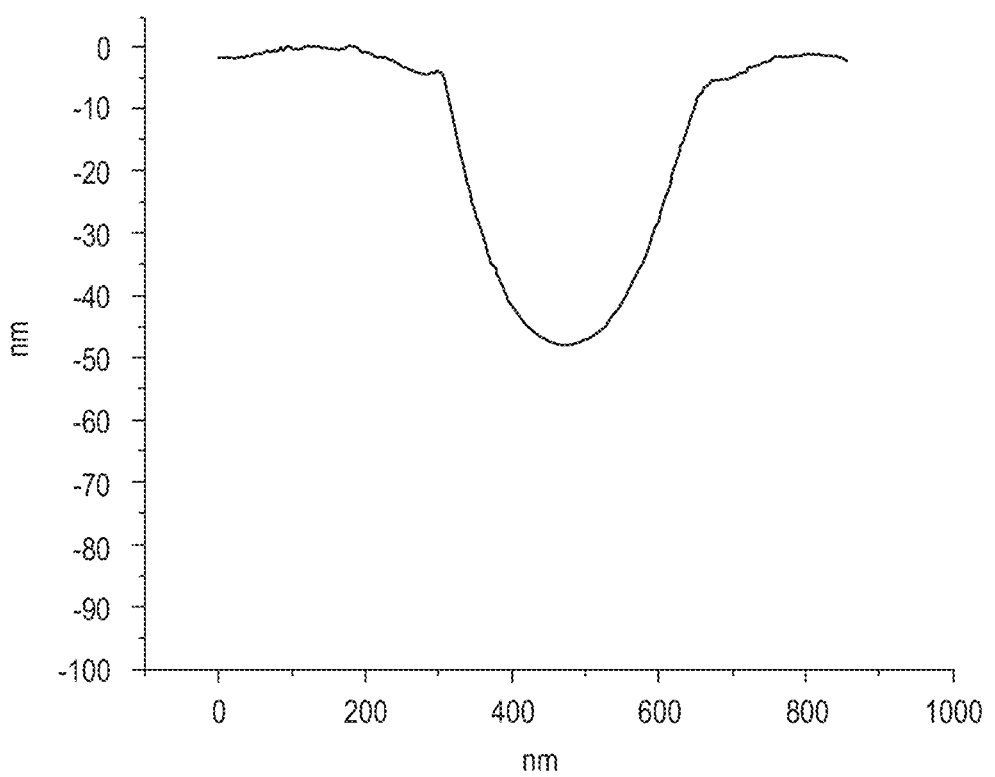
FIG. 7D is a graph showing the depth profile of a filled 200 nm hole of FIG. 7C.

FIG. 7C is an AFM image of the 200 nm hole pattern of FIG. 7A after filling the holes with polystyrene using a 0.8 wt % solution of polystyrene in PGMEA. FIG. 7D is a graph showing the depth profile of a filled 200 nm hole of FIG. 7C.

Figure 8A:
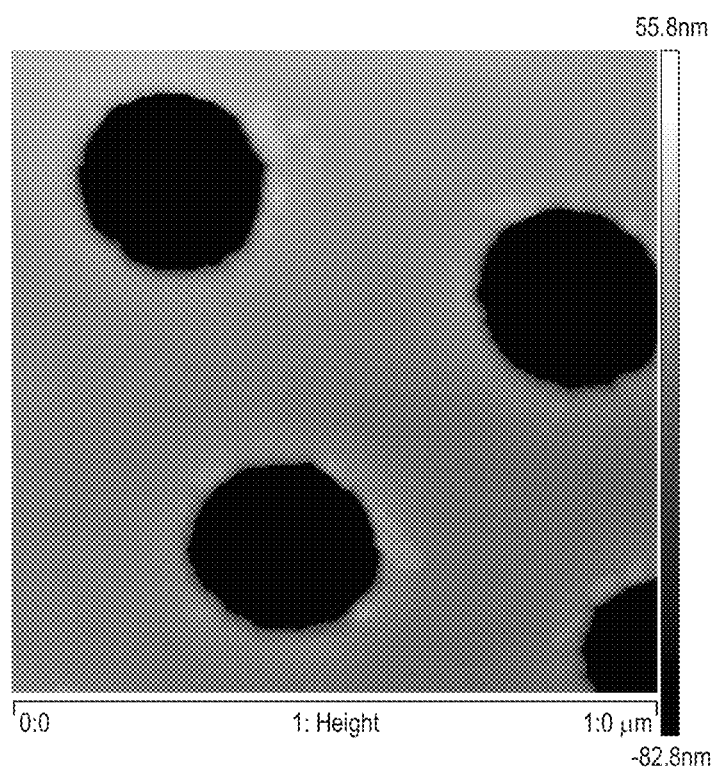
FIG. 8A is an AFM image of a second 200 nm hole pattern before filling the holes with polystyrene (Example 6).
Figure 8B:
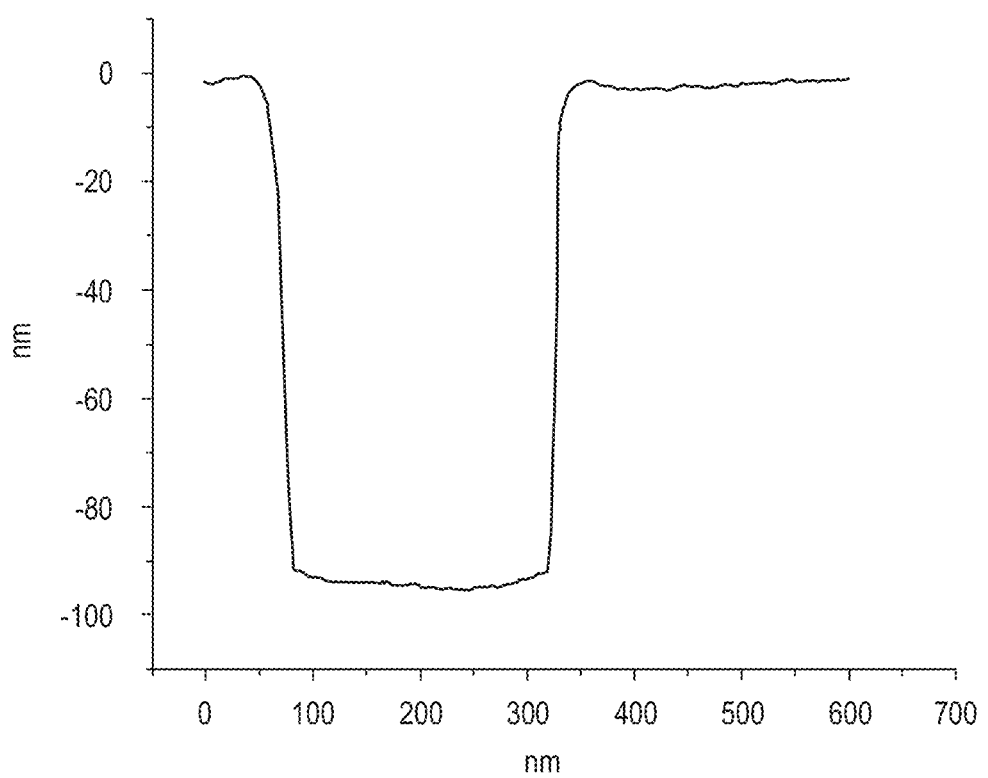
FIG. 8B is a graph of the depth profile of a 200 nm hole of FIG. 8A.

FIG. 8A is an AFM image of a second 200 nm hole pattern before filling the holes with polystyrene. FIG. 8B is a graph showing the depth profile of a 200 nm hole of FIG. 8A.

Figure 8C:
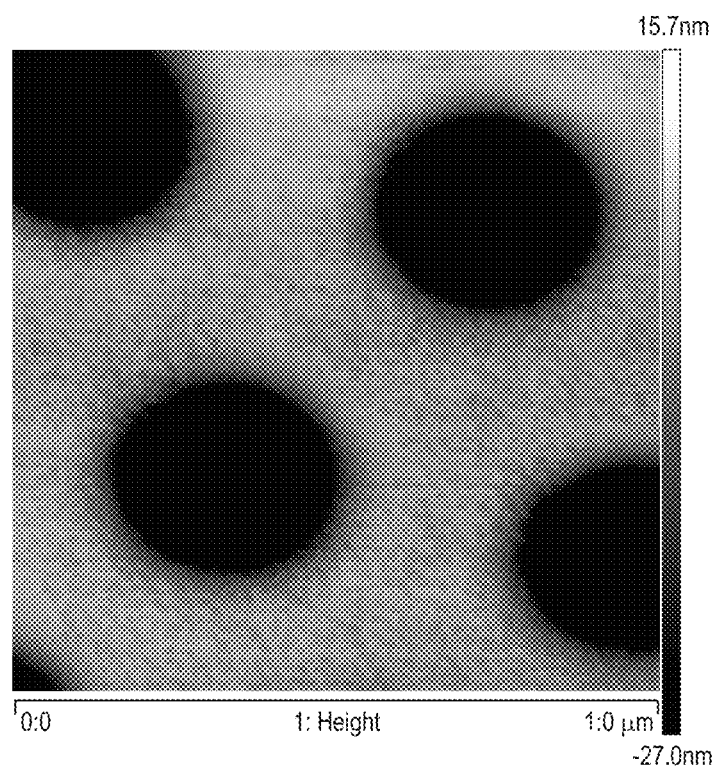
FIG. 8C is an AFM image of the 200 nm hole pattern of FIG. 8A after filling the holes with polystyrene using a 1.2 wt % solution of polystyrene in PGMEA (Example 6).
Figure 8D:
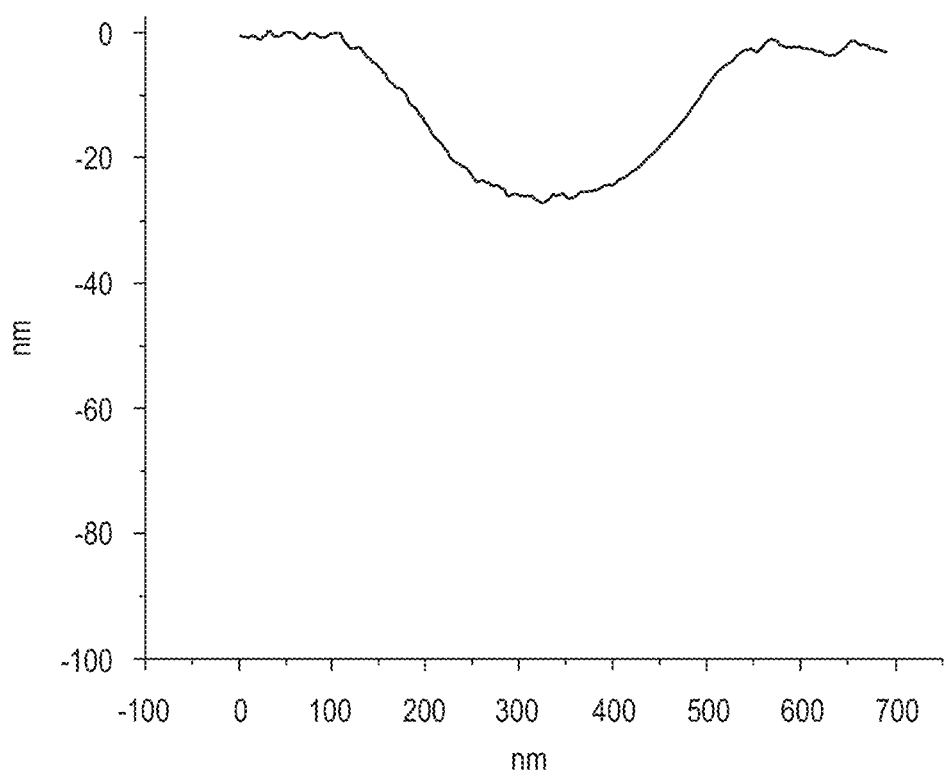
FIG. 8D is a graph showing the depth profile of a filled 200 nm hole of FIG. 8C (Example 6).

FIG. 8C is an AFM image of a 200 nm hole pattern of FIG. 8A after filling the holes with polystyrene using a 1.2 wt % solution of polystyrene in PGMEA. FIG. 8D is a graph showing the depth profile of a filled 200 nm hole of FIG. 8C.

Figure 9A:
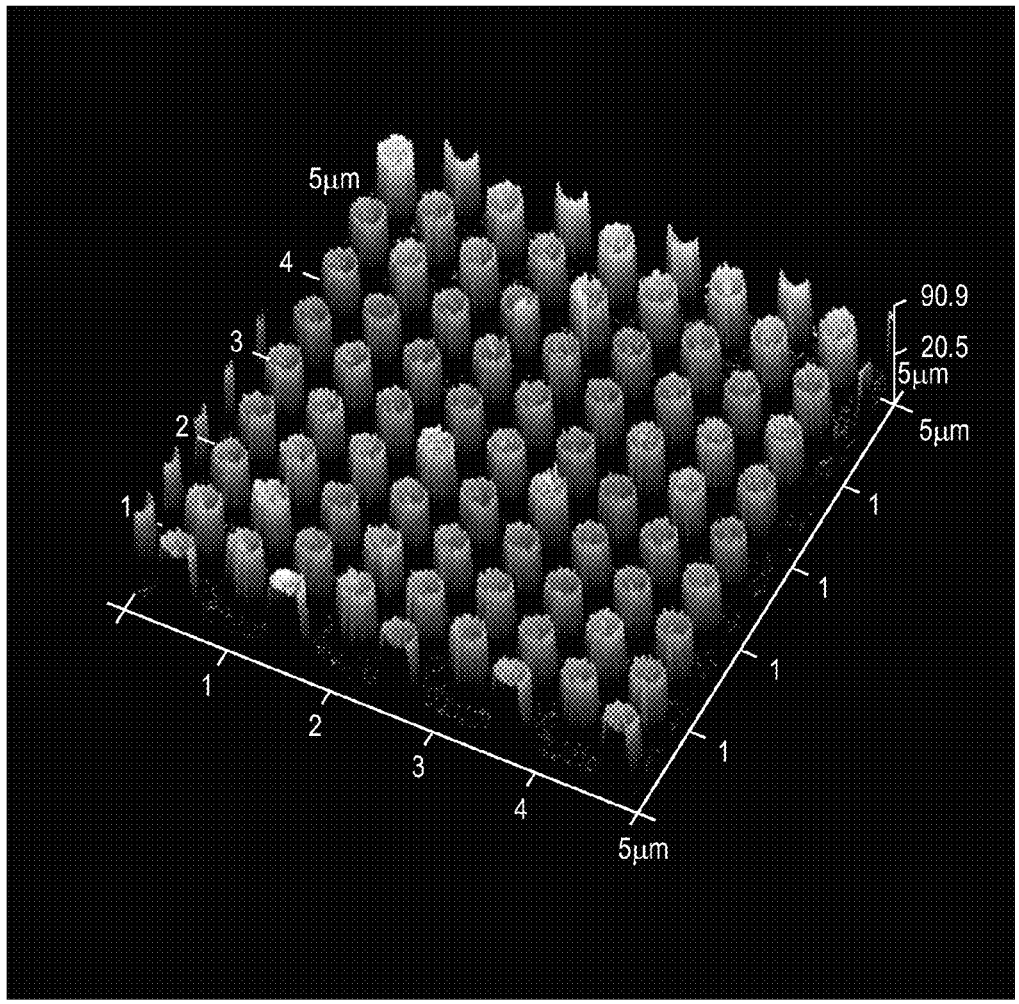
FIG. 9A is an AFM image showing the polystyrene cylinders remaining after developing the polystyrene filled hole pattern of FIG. 8C with aqueous TMAH, which selectively removed the resist (Example 6).

FIG. 9A is an AFM image showing the polystyrene cylinders remaining after developing the polystyrene filled hole pattern of FIG. 8C with aqueous TMAH, which selectively removed the resist.

Figure 9B:
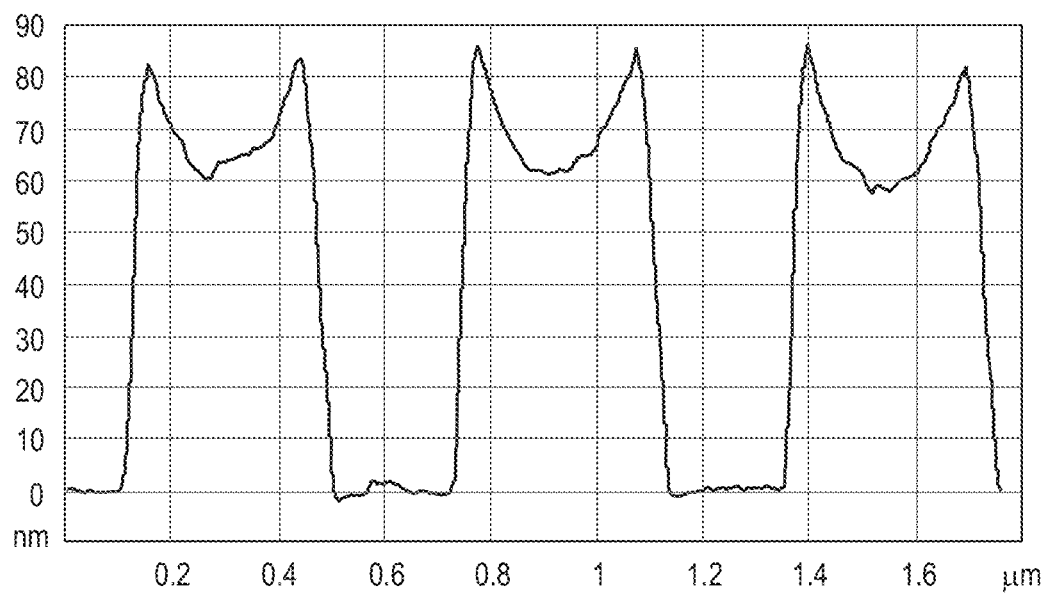
FIG. 9B is graph showing a depth profile of the polystyrene cylinders of FIG. 9A.

FIG. 9B is graph showing a depth profile of the polystyrene cylinders of FIG. 9A.

Example 7

Figure 10:
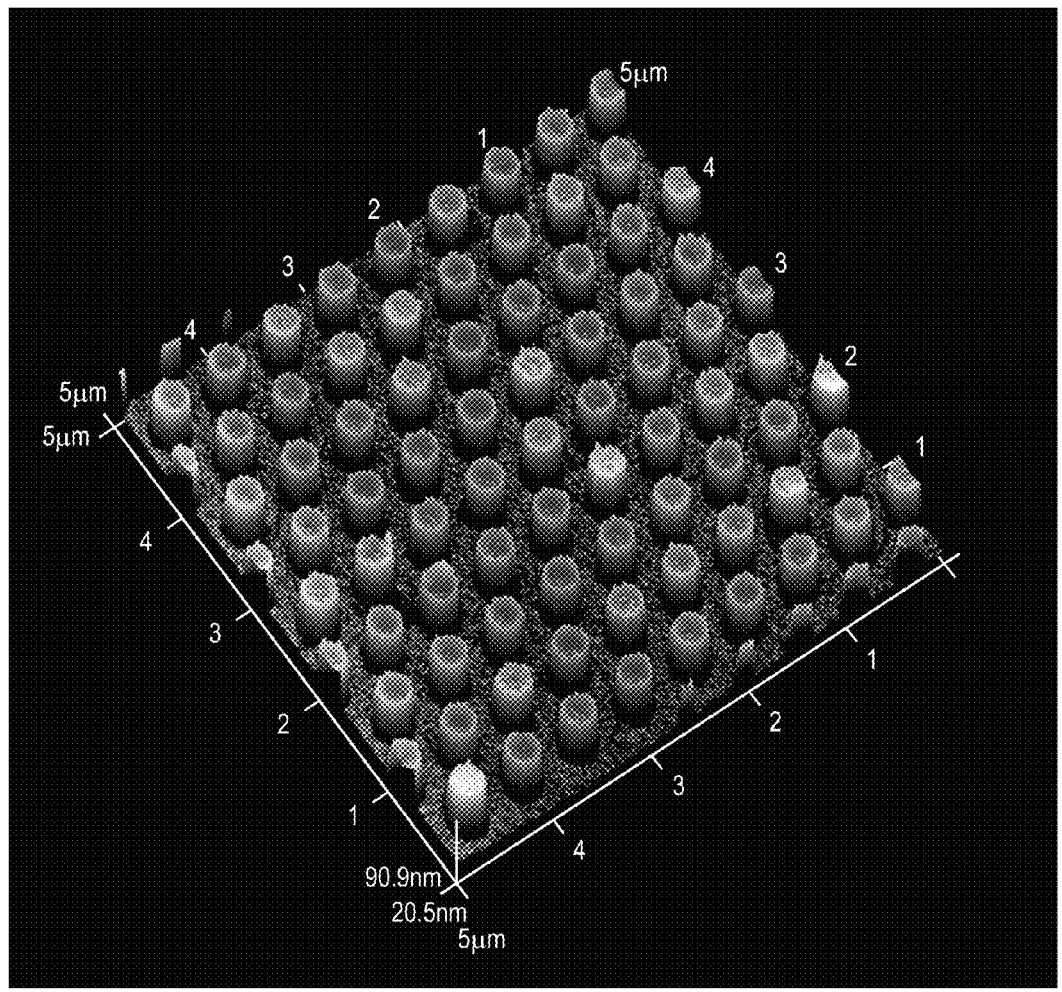
FIG. 10 is an AFM image showing poly(lactide) cylinders attached to the substrate after developing the poly(lactide) filled hole pattern of Example 7 with TMAH. The cylinders have a height of about 70 nm and a diameter of about 250 nm.
Figure 10:
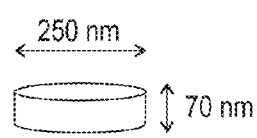
Figure 11:
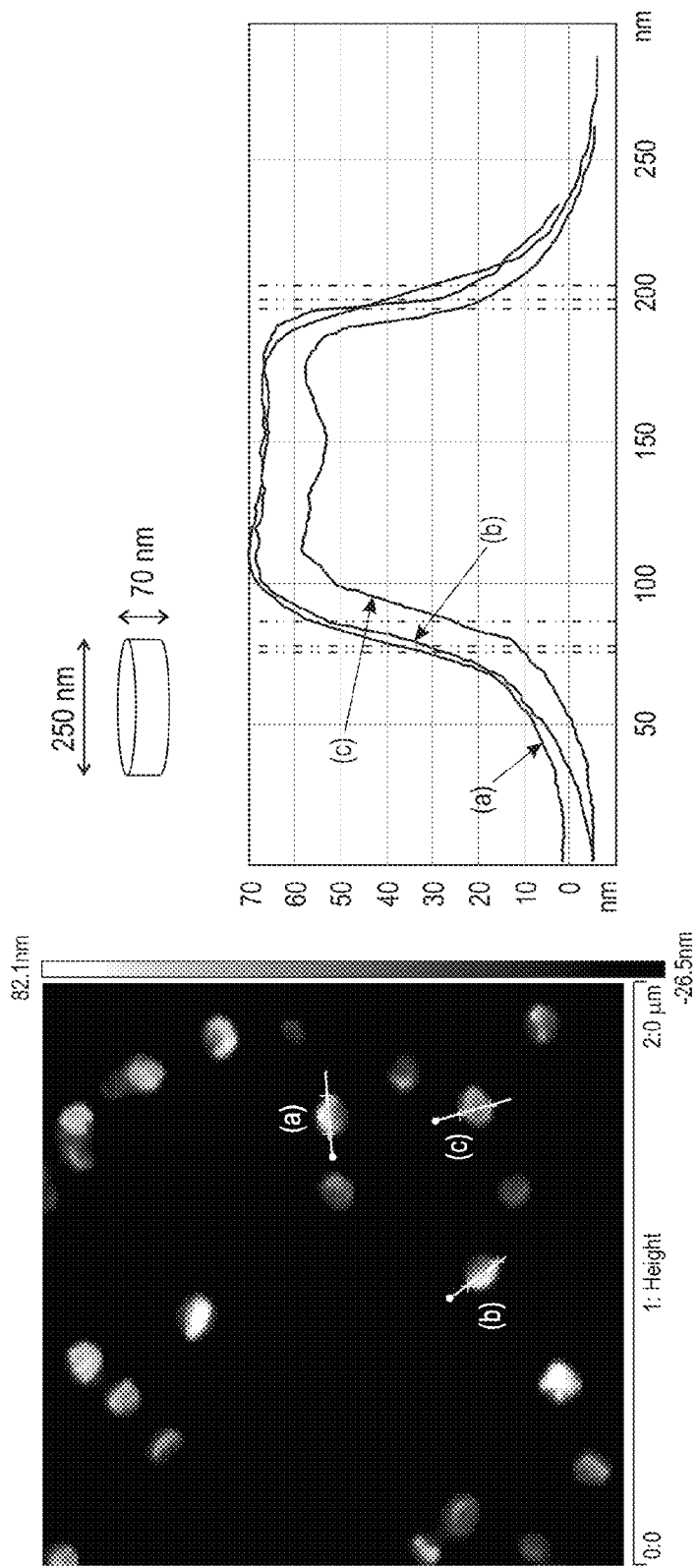
FIG. 11 is an AFM image and depth profile graph of poly(lactide) particles after delaminating the particles from the substrate using methanol (Example 7). The graph shows the depth profile of three of the particles of the AFM image, indicated by the arrows. The cylinders have a diameter of about 250 nm and a height of about 70 nm.

Filling of lithographically patterned holes with poly(lactide). Poly(lactide) (0.8 wt % in PGMEA) was spin-coated onto lithographically patterned substrates (2.0 cm×2.0 cm). In general, the substrates were spin-coated for 30 seconds at 2000 rpm. The substrates were then dipped into TMAH developer aqueous solution (0.26 N) for 10 seconds to remove the photoresist patterns. FIG. 10 is an AFM image showing the poly(lactide) cylinders attached to the substrate after the development. The cylinders have a height of about 70 nm and a diameter of about 250 nm. Longer exposure to methanol enabled the removal of the particles from the surface. FIG. 11 is an AFM image showing the poly(lactide) cylinders after delamination from the substrate. The cylinders had a height of about 60 nm and a diameter of about 110 nm.

Example 8
Synthesis of beta-cyclodextrin-(L-Lactide)₅-methacrylate
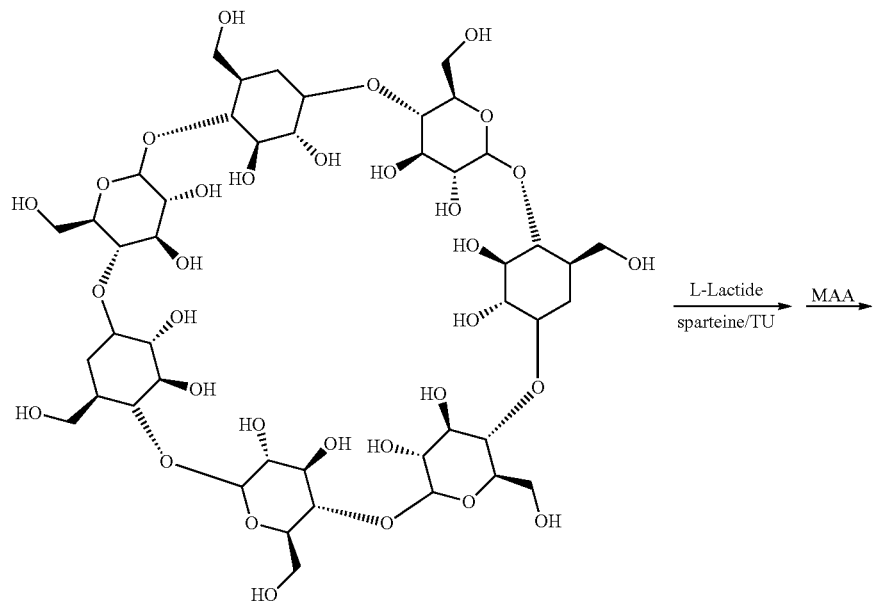
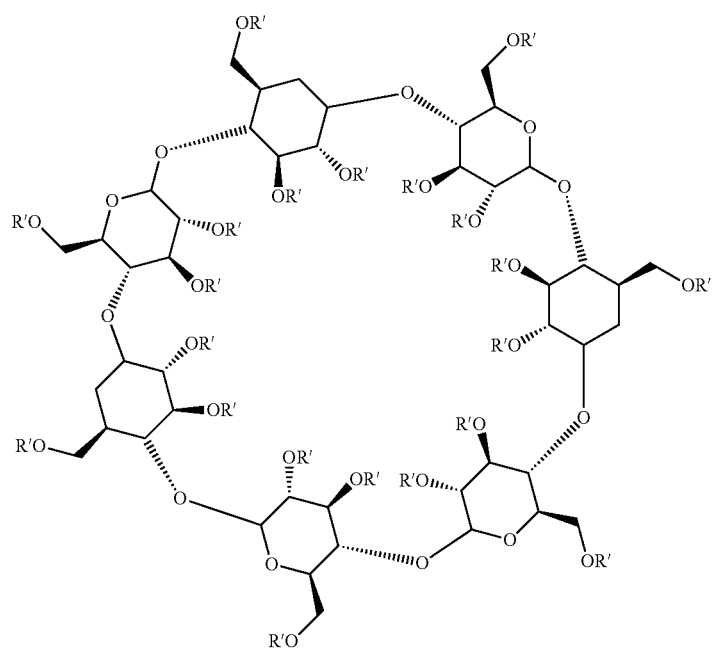
b-CD
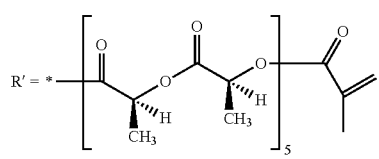

A) In a nitrogen filled glovebox a flask was charged with dried beta-cyclodextrin (b-CD) (0.750 g, 0.660 mmol), L-lactide (LLA) (10.0 g, 69.4 mmol), thiourea (TU) (0.150 g, 0.400 mmol), DMSO (15 g), methylene chloride (3 g) and stir bar. The polymerization was initiated by addition of (−)-sparteine (0.150 g, 0.634 mmol) followed by slow addition of methylene chloride (10 g). Upon full monomer conversion, the reaction mixture was twice precipitated into 2-propanol then in hexanes. The beta-cyclodextrin-(L-Lactide)$_5$-OH was dried under vacuum overnight (10.1 g, 94%).

beta-Cyclodextrin-(L-Lactide)$_5$-OH (10 g, 0.614 mmol) was dissolved in dry pyridine (35 mL) and cooled to 10° C. under a nitrogen atmosphere. Separately, methacrylic anhydride (MAA) (11.9 g, 77.5 mmol) was dissolved in methylene chloride (5 mL) and added dropwise to the stirred polymer solution. The cooling bath was removed and the reaction mixture warmed to 55° C. and stirred for 20 hours. The reaction mixture was twice precipitated into 2-propanol and dried under vacuum.

Figure 12:
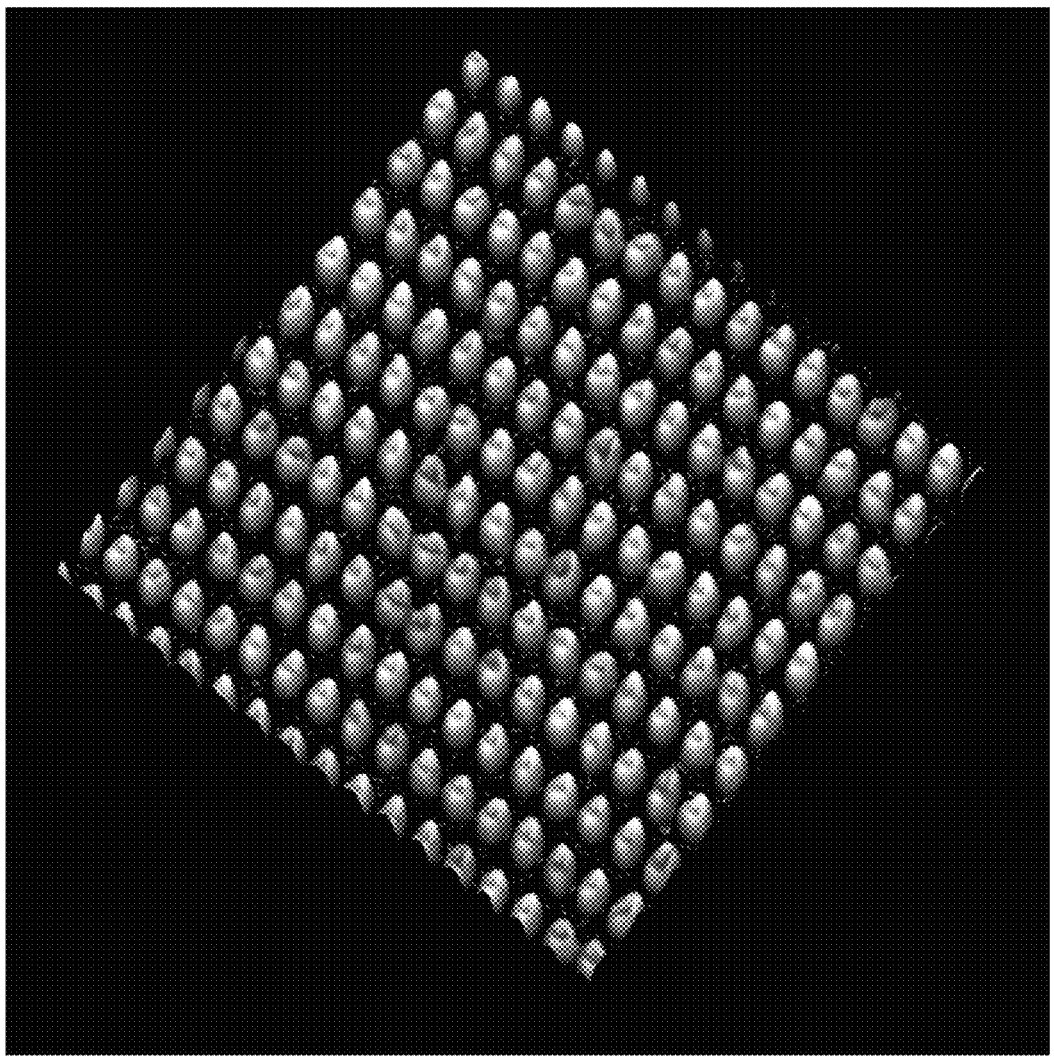
FIG. 12 is an AFM image of an array of crosslinked beta-Cyclodextrin-(L-Lactide)$_5$-methacrylate nanoparticles (200 nm×300 nm×45 nm) after developing the filled hole pattern of Example 9 with TMAH.

Example 9 beta-Cyclodextrin-(L-Lactide)$_5$-methacrylate particles. beta-Cyclodextrin-(L-Lactide)$_5$-methacrylate (10 mg) was dissolved in PGMEA (990 mg) containing 1 wt % pentaerythritol tetra(3-mercaptopropionate) (Aldrich Chemicals). The solution was then spin-coated onto lithographically patterned substrates (2.0 cm×2.0 cm) for 30 s at 2000 rpm. The substrates were then irradiated with a 254 nm UV lamp for 2 minutes to generate thiyl radicals which subsequently underwent thiol-ene reactions with methacrylate. The substrate was baked at 100° C. for 10 minutes. The substrates were then dipped into TMAH developer aqueous solution (0.26 N) for 10 seconds to remove the photoresist patterns. FIG. 12 is an AFM image of the resulting array of crosslinked nanoparticles (200 nm×300 nm×45 nm).

Example 10 beta-Cyclodextrin-(L-Lactide)$_5$-Methacrylate Particles. beta-Cyclodextrin-(L-Lactide)$_5$-Methacrylate (10 mg) and DAROCUR-1173 (0.5 mg; available from BASF) were dissolved in PGMEA (990 mg). The solution was then spin-coated onto lithographically patterned substrates (2.0 cm×2.0 cm) for 30 seconds at 2000 rpm. The substrates were then irradiated with a 365 nm UV lamp for 2 minutes to generate radicals to initiate the thiol-ene reactions. The substrate was baked at 100° C. for 10 minutes and then dipped into TMAH developer aqueous solution (0.26 N) for 10 seconds to remove the photoresist patterns.

Example 11

Filling of lithographically patterned holes on a release layer. Polystyrene (45 k) was spin-coated onto the lithographically patterned substrates (2.0 cm×2.0 cm) in Example 4. The polymer was spin-coated for 30 seconds at 2000 rpm and the substrate was baked at 150° C. for 60 seconds. The substrate was dipped into a TMAH aqueous developer solution (0.26 N) for 10 seconds to remove the photoresist patterns. The substrate was then treated with a solution of 200:1 dilute hydrogen fluoride (DHF, prepared by diluting 1 part 49% aqueous HF with 100 parts water) which etched the SiARC layer and enabled the release of the particles from the substrate.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A method, comprising:
   forming by optical lithography, using a positive tone resist and positive tone development, a topographic template layer disposed on a surface of a substrate, wherein i) the substrate is suitable for spin casting and ii) the template layer comprises a non-crosslinked template polymer having a pattern of independent wells therein for molding independent particles;
   spin casting a particle-forming composition onto the template layer, thereby forming a composite layer comprising the template polymer and the particles disposed in the wells;
   removing the composite layer from the substrate using a stripping agent that dissolves the template polymer without dissolving the particles; and
   isolating the particles.

2. The method of claim 1, wherein the spin casted composition comprises a casting solvent and the casting solvent is removed from the spin casted composition, thereby forming the particles disposed in the wells.

3. The method of claim 1, wherein the particles are treated photochemically, thermally, and/or chemically before removing the composite layer from the substrate.

4. The method of claim 1, wherein the substrate comprises a release layer, and the template layer is disposed on a surface of the release layer.

5. The method of claim 4, wherein the release layer comprises silicon, and the release layer is soluble in an aqueous hydrogen fluoride solution.

6. The method of claim 1, wherein the particles disposed in the wells comprise a crosslinked binder.

7. The method of claim 1, wherein the particles disposed in the wells comprise a non-crosslinked binder.

8. The method of claim 1, wherein the template layer has a thickness, and the wells have a sidewall height which is less than or equal to the thickness of the template layer.

9. The method of claim 1, wherein the isolated particles have an average circular diameter of about 100 nm to about 500 nm.

10. The method of claim 1, wherein the stripping agent comprises an aqueous base.

11. The method of claim 1, wherein the stripping agent comprises an organic solvent.

12. The method of claim 1, wherein the particles comprise a medically useful substance in contact with a polymer binder.

13. The method of claim 12, wherein the medically useful substance is selected from the group consisting of $CoFe_2O_4$, gold metal, anti-inflammatory agent, anti-tumor agent, immunosuppressant, anti-viral agent, antibiotic agent, steroid, hormone, and combinations thereof.

14. The method of claim 12, wherein the polymer binder is selected from the group consisting of polystyrenes, polyacrylates, polymethacrylates polycarbonates, polyesters, and combinations thereof.

15. The method of claim 1, wherein the composite layer is removed from the substrate by:
  removing the template polymer from the substrate using the stripping agent, leaving behind substantially all of the particles disposed on the substrate; and
  removing the particles from the substrate.

16. The method of claim 1, wherein the stripping agent removes the template polymer and the particles simultaneously from the substrate, thereby forming a liquid mixture, and the particles are isolated from the liquid mixture.

17. The method of claim 1, wherein the template layer is formed using a patternwise optical exposure to radiation having a wavelength of 248 nm and/or 193 nm.

18. The method of claim 1, wherein the particles have the shape of a ring.

19. The method of claim 18, wherein the particles comprise sub-particles.

20. A method, comprising:
  forming by optical lithography, using a positive tone resist and positive tone development, a patterned template on a substrate, wherein the template is insoluble in a particular organic solvent but soluble in a given aqueous and/or organic solution;
  casting a formulation onto the patterned template, the formulation including material in the organic solvent;
  removing the organic solvent, thereby leaving behind nanoparticles in contact with the template;
  optionally treating the nanoparticles photochemically, thermally, and/or chemically;
  using the solution to remove both the template and the nanoparticles; and
  isolating the nanoparticles from the template.

21. The method of claim 20, wherein the template and the nanoparticles are removed simultaneously.

22. The method of claim 20, wherein the material includes a polymer binder in contact with a medically useful substance.

23. A method, comprising:
  forming by optical lithography, using a positive tone resist and positive tone development, a patterned template on a substrate, wherein the template is insoluble in a particular organic solvent but soluble in a given aqueous and/or organic solution;
  casting a formulation onto the patterned template, the formulation including material in the organic solvent, removing the organic solvent, thereby leaving behind nanoparticles in contact with the template;
  optionally treating the nanoparticles photochemically, thermally, and/or chemically;
  removing the template using the solution, while leaving most of the nanoparticles behind on the substrate; and
  removing the nanoparticles from the substrate.

24. The method of claim 23, wherein the removed nanoparticles are in a stripping solution, the method further comprising: isolating the nanoparticles from the stripping solution.

25. The method of claim 23, wherein the material includes a polymer binder in contact with a medically useful substance.

* * * * *